(12) United States Patent
Makiyama

(10) Patent No.: US 7,960,763 B2
(45) Date of Patent: Jun. 14, 2011

(54) SEMICONDUCTOR DEVICE AND METHOD OF MANUFACTURING THE SAME

(75) Inventor: Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 86 days.

(21) Appl. No.: 12/186,872

(22) Filed: Aug. 6, 2008

(65) Prior Publication Data
US 2008/0290372 A1   Nov. 27, 2008

Related U.S. Application Data

(63) Continuation of application No. PCT/JP2006/302046, filed on Feb. 7, 2006.

(51) Int. Cl.
*H01L 29/80* (2006.01)
*H01L 31/112* (2006.01)
(52) U.S. Cl. ............ 257/256; 257/649; 257/E27.148
(58) Field of Classification Search .......... 257/256, 257/272, 629, 639, 940, 649, E27.148
See application file for complete search history.

(56) References Cited

U.S. PATENT DOCUMENTS

| | | | |
|---|---|---|---|
| 5,210,052 A | 5/1993 | Takasaki | |
| 5,284,789 A | 2/1994 | Mori | |
| 5,918,147 A | 6/1999 | Filipiak | |
| 2002/0130389 A1 | 9/2002 | Arimochi et al. | |
| 2004/0007748 A1 | 1/2004 | Sakama et al. | |

FOREIGN PATENT DOCUMENTS

| | | |
|---|---|---|
| EP | 0454100 | 10/1991 |
| JP | 63-161625 A | 7/1988 |
| JP | 64-20629 | 1/1989 |
| JP | 64-50535 A | 2/1989 |
| JP | 2-303118 A | 12/1990 |
| JP | 3-240265 A | 10/1991 |
| JP | 4-6835 A | 1/1992 |
| JP | 9-102494 A | 4/1997 |
| JP | 2792948 B2 | 9/1998 |
| JP | 11-204542 A | 7/1999 |
| JP | 2000-323495 A | 11/2000 |
| JP | 2001-15693 A | 1/2001 |
| JP | 2001-135824 A | 5/2001 |
| JP | 2002-110674 A | 4/2002 |

OTHER PUBLICATIONS

International Search Report of PCT/JP2006/302046, date of mailing May 16, 2006.
European Patent Office; Extended European Search Report mailed Jul. 26, 2010 in connection with U.S. Appl. No. 12/186,872 correspondent EP application 06 71 3189.

*Primary Examiner* — Hoai v Pham
(74) *Attorney, Agent, or Firm* — Fujitsu Patent Centr

(57) ABSTRACT

A semiconductor device includes a substrate, a compound semiconductor layer formed over the substrate, and a protective insulating film composed of silicon nitride, which is formed over a surface of the compound semiconductor layer and whose film density in an intermediate portion is lower than that in a lower portion.

5 Claims, 29 Drawing Sheets

FIG. 4

| Sample No. | Flow Rate Ratio of Film-Forming Gases ($SiH_4:NH_3:N_2$) | Frequency, Power of High-frequency Power Source 104 | N(%) | Si(%) | H(%) | Density(g/cm$^2$) |
|---|---|---|---|---|---|---|
| 1 | 1:0:100 | 380kHz, 50W | 49.1 | 37.4 | 13.5 | 2.49 |
| 2 | 1:0:100 | 13.56MHz, 50W | 41.2 | 41.9 | 16.9 | 2.42 |
| 3 | 1:0.5:100 | 13.56MHz, 50W | 38.3 | 36.4 | 25.3 | 2.15 |
| 4 | 1:0:80 | 13.56MHz, 80W | 41.1 | 42.7 | 16.2 | 2.21 |

FIG. 6

| Magnitude Relationship of Film Density among Respective Silicon Nitride Films ||  |
|---|---|---|
| First Layer Silicon Nitride Film 20a | > | Second Layer Silicon Nitride Film 20b |
| Second Layer Silicon Nitride Film 20b | < | Third Layer Silicon Nitride Film 20c |
| Third Layer Silicon Nitride Film 20c | > | Fourth Layer Silicon Nitride Film 20d |
| Fouth Layer Silicon Nitride Film 20d | < | Fifth Layer Silicon Nitride Film 20e |
| Fifth Layer Silicon Nitride Film 20e | > | Sixth Layer Silicon Nitride Film 20f |

US 7,960,763 B2

SEMICONDUCTOR DEVICE AND METHOD OF MANUFACTURING THE SAME

CROSS-REFERENCE TO RELATED APPLICATIONS

This application is a continuation of prior International Patent Application No. PCT/JP2006/302046, filed Feb. 7, 2006, the entire contents of which are incorporated herein by reference.

TECHNICAL FIELD

It is related to a semiconductor device and a method of manufacturing the same.

BACKGROUND

A junction field-effect transistor, in which a compound semiconductor layer is used for an electron transport layer and the like, is useful as a high-power semiconductor device. Surfaces of the compound semiconductor layers used for the semiconductor devices are chemically and physically weak, when compared with surfaces of silicon layers or the like. Accordingly, once oxidized, the surface of a compound semiconductor layer allows the generation of electron traps or the like and thus is not suitable any more for practical use.

For this reason, when this type of semiconductor device is manufactured, a protective insulating film is formed on the surface of the uppermost compound semiconductor layer so as to prevent the compound semiconductor layer from being oxidized during manufacturing processes.

Various examples of the protective insulating film are disclosed in the following patent Documents 1 to 4 (Japanese Unexamined Patent Application Laid-Open Publication No. Hei 4-6835, Japanese Unexamined Patent Application Laid-Open Publication No. Hei 3-240265, Japanese Unexamined Patent Application Laid-Open Publication No. 2000-323495, Japanese Patent No. 2792948).

For example, in the patent Document 1 (Japanese Unexamined Patent Application Laid-Open Publication No. Hei 4-6835), a film in which a first silicon nitride (SiN) film with high hydrogen content and a second silicon nitride film with low hydrogen content are stacked in this order is used as a protective insulating film.

However, this protective insulating film has a disadvantage that hydrogen moves from the first silicon nitride film with high hydrogen content to a substrate and then neutralizes donors, thereby making it difficult for a current to flow between a source electrode and a drain electrode.

As described above, in a semiconductor device including a compound semiconductor layer, it is important to stabilize a surface state of the compound semiconductor layer and to improve the electric characteristics thereof, by optimizing the film quality of a silicon nitride film functioning as a protective insulating film.

SUMMARY

It is an aspect of the embodiment discussed herein to provide a semiconductor device including a substrate, a compound semiconductor layer formed on the substrate, and a protective insulating film composed of silicon nitride, which is formed on a surface of the compound semiconductor layer and whose film density in an intermediate portion is lower than that in a lower portion.

BRIEF DESCRIPTION OF THE DRAWINGS

FIG. 4 is a table showing research results of film densities of silicon nitride films obtained by variously changing film-forming conditions by using an RBS (Rutherford Backscattering Spectrometry);

FIG. 6 is a table showing a magnitude relationship of film densities among silicon nitride films in the second example of the first embodiment;

DETAILED DESCRIPTION OF THE EMBODIMENTS

Figure 1A:
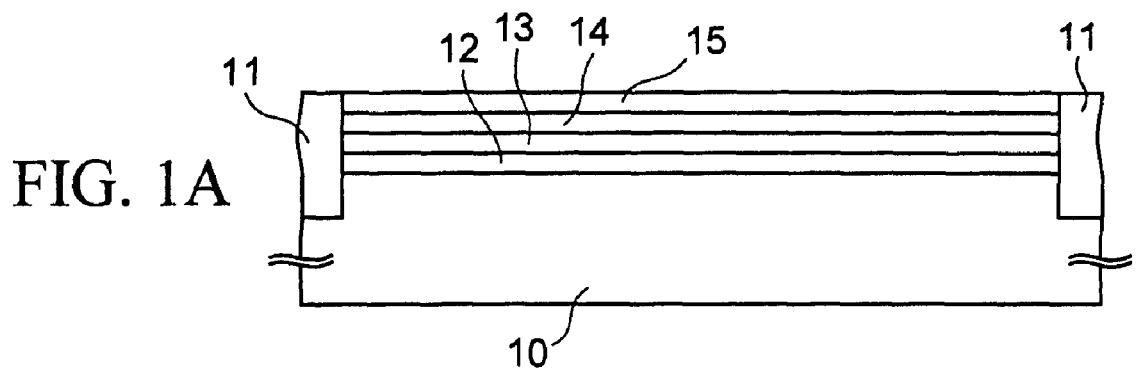
FIGS. 1A to 1J are cross-sectional views showing processes of manufacturing a semiconductor device according to a first embodiment.

Embodiments will be described below in detail by referring to the accompanying drawings.

(1) First Embodiment

FIGS. 1A to 1J are cross-sectional views showing processes of manufacturing a semiconductor device according to the present embodiment.

Firstly, processes for obtaining a cross-sectional structure shown in FIG. 1A will be described.

First, a buffer layer 12 formed of GaAs, an electron transport layer 13 formed of InGaAs, an electron supply layer 14 formed of AlGaAs, and a contact layer 15 formed of GaAs are caused to grow epitaxially on a semi-insulating GaAs substrate 10 by using a MOCVD (Metal Organic Chemical Vapor Deposition) method. Of these layers, the buffer layer 12 has a function to prevent lattice defects on the surface of the GaAs substrate 10 from influencing the electron transport layer 13. In addition, the contact layer 15 is formed for making ohmic contact with a source electrode or a drain electrode, both of which will be formed next.

Subsequently, oxygen is ion-implanted into each of the layers 12 to 15 and GaAs substrate 10 in a region where a transistor is not formed, so that donors in the region are inactivated. Thereby, device isolation regions 11 are formed.

Figure 1B:
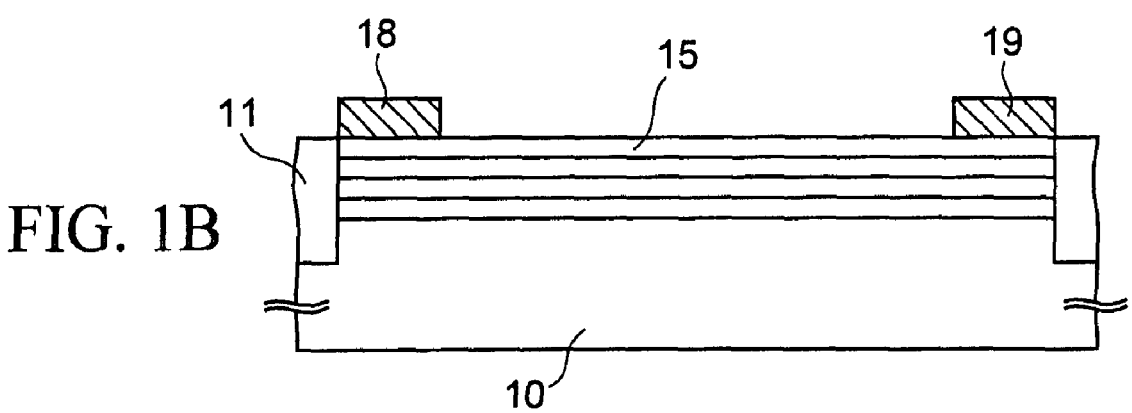

After that, as shown in FIG. 1B, by photolithography and a vacuum evaporation method, an AuGe film with a thickness of approximately 20 nm and an Au film with a thickness of approximately 200 nm are formed in this order on the contact layer 15, then a source electrode 18 and a drain electrode 19, respectively, with being spaced from each other are formed, and then are thermally processed at a temperature of 350° C. for three minutes to form ohmic contact.

Figure 1C:
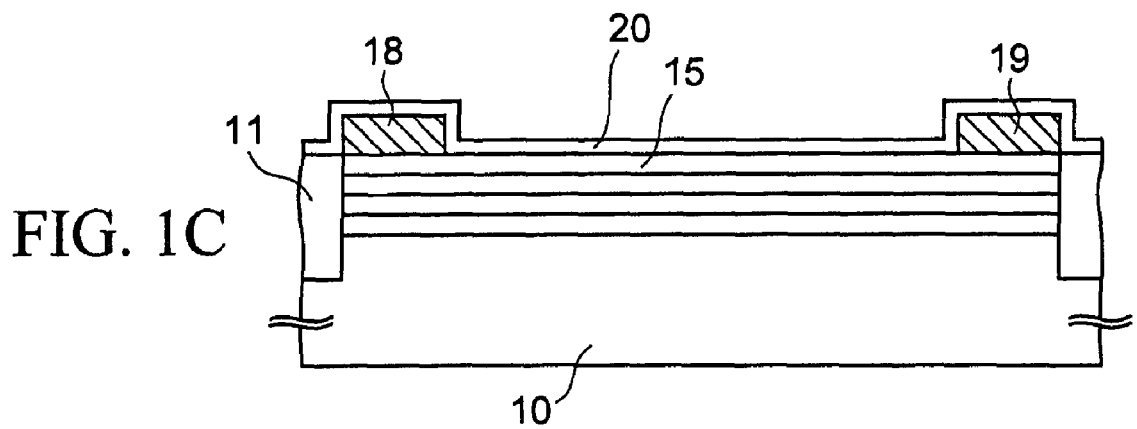

Thereafter, as shown in FIG. 1C, a first protective insulating film 20 composed of silicon nitride is formed on the surfaces of the electrodes 18 and 19 and the contact layer 15 by a plasma CVD method. This first protective insulating film 20 is formed in order to protect the surface of the contact layer 15 which is chemically and physically weak, to prevent the surface thereof from being oxidized during manufacturing processes, and to improve electric characteristics of a transistor which is to be finally obtained.

Note that, the layer structure and film-forming conditions of this first protective insulating film 20 will be described later in detail.

Figure 1D:
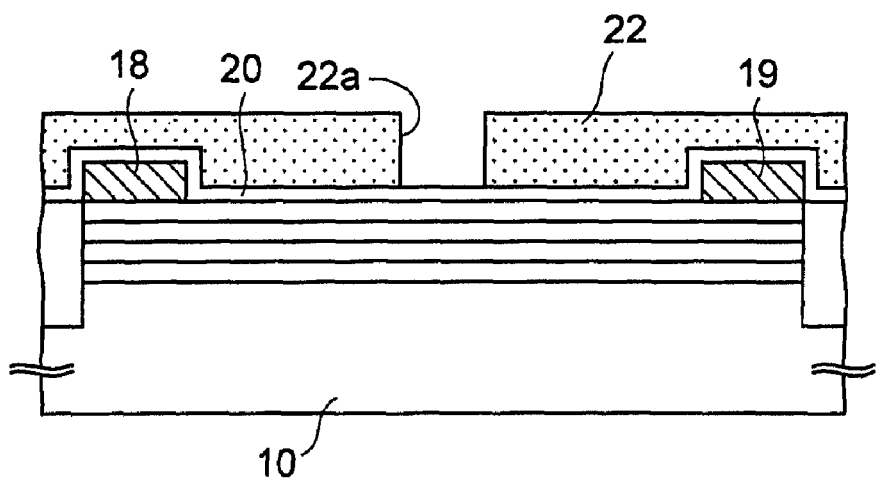

Next, as shown in FIG. 1D, a UV-sensitive photoresist is coated on the first protective insulating film 20. The coated film is exposed and developed to form a first resist pattern 22 having a first window 22a between the electrodes 18 and 19. In the present embodiment, PFI32-A8, produced by Sumitomo Chemical Co., Ltd., is used as the UV-sensitive photoresist.

Figure 1E:
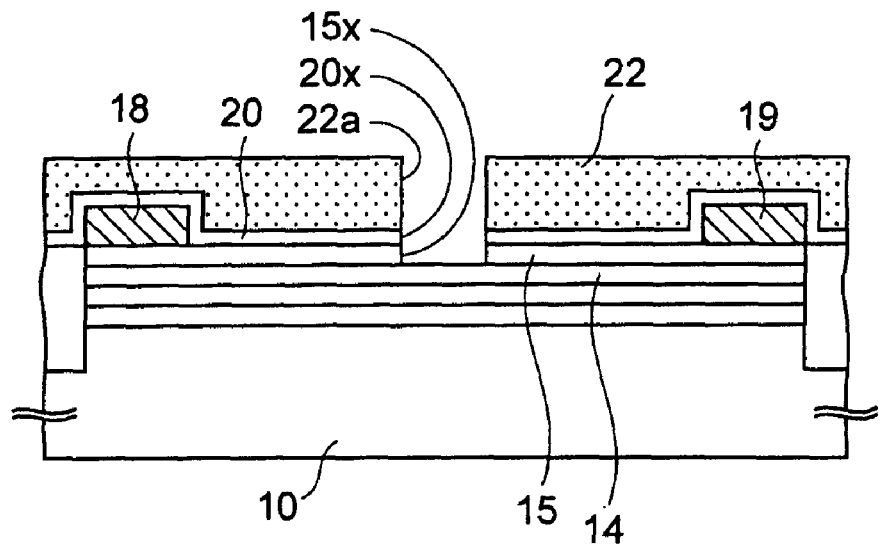

Subsequently, as shown in FIG. 1E, by using the above-described first resist pattern 22 as a mask, the first protective insulating film 20 is etched by dry etching using $SF_6$ as an etching gas to form a first opening 20x in the first protective insulating film 20 under the first window 22a. Furthermore, the contact layer 15 is etched by dry etching using $SiCl_4$ to form a second opening 15x under the first opening 20x.

After this etching is finished, the first resist pattern 22 is removed by using a heated stripping agent.

Figure 1F:
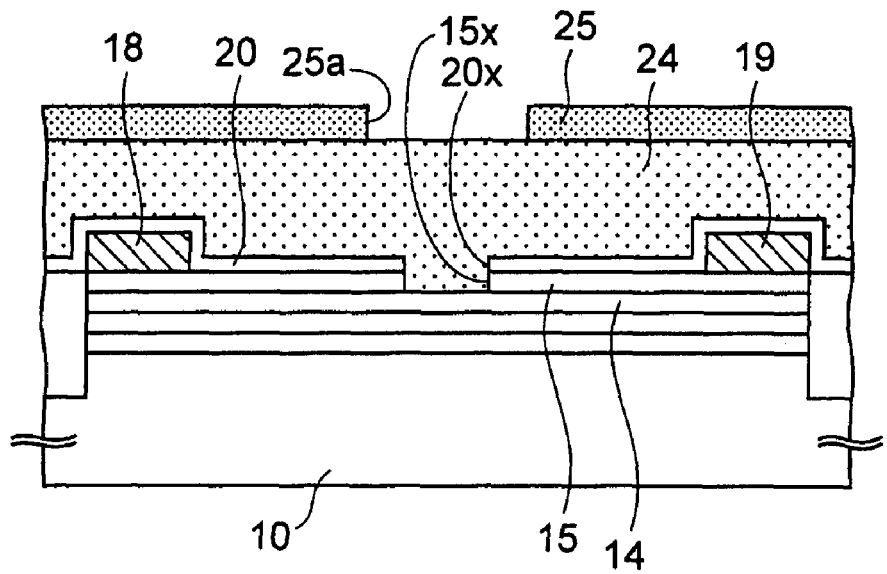

Next, as shown in FIG. 1F, a resin, which is soluble in alkaline solution and can be side-etched, for example, polymethylglutarimide (PMGI) is formed as a resin layer 24 with a thickness of approximately 500 nm on the first protective insulating film 20 and inside the first and second openings 20x and 15x.

Then, the resin layer 24 is cured by heating under conditions with the substrate temperature of 180° C. and processing time of three minutes.

Thereafter, a UV-sensitive photoresist is coated on the resin layer 24. The coated UV-sensitive photoresist is exposed and developed to form a second resist pattern 25 having a second window 25a whose width is larger than that of the first opening 20x. Although the UV-sensitive photoresist is not particularly limited, PFI32-A8, produced by Sumitomo Chemical Co., Ltd., is used in the present embodiment.

Figure 1G:
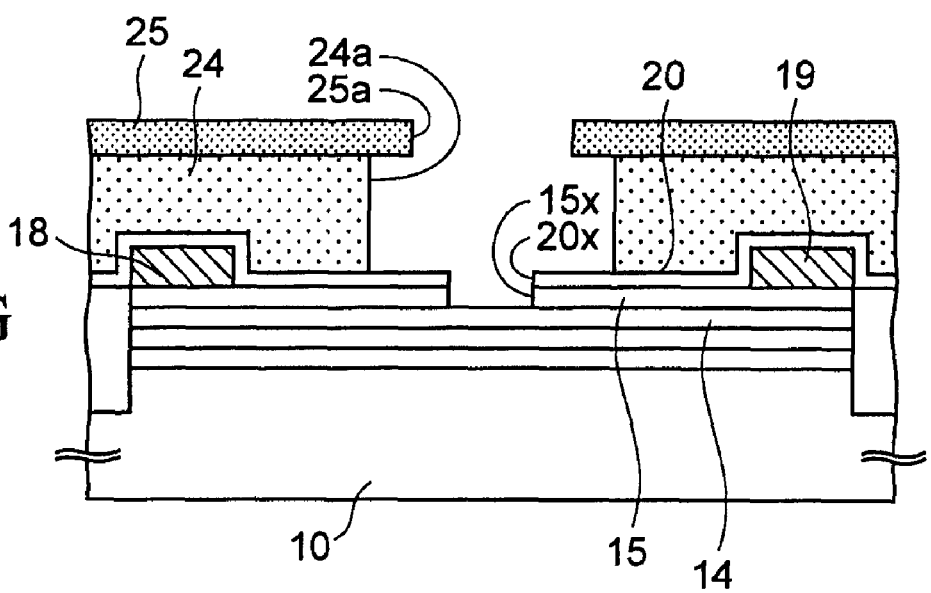

Subsequently, as shown in FIG. 1G, the resin layer 24 is wet-etched through the second window 25a of the second resist pattern 25. In this wet etching, an alkaline etchant selectively etching the resin layer 24, for example, an aqueous solution of tetramethylammonium hydroxide (TMAH), is used for side etching of the resin layer 24.

Thereby, a third window 24a whose width is larger than that of the second window 25a is formed in the resin layer 24, and the electron supply layer 14 inside the first and second openings 20x and 15x is exposed from the third window 24a.

Figure 1H:
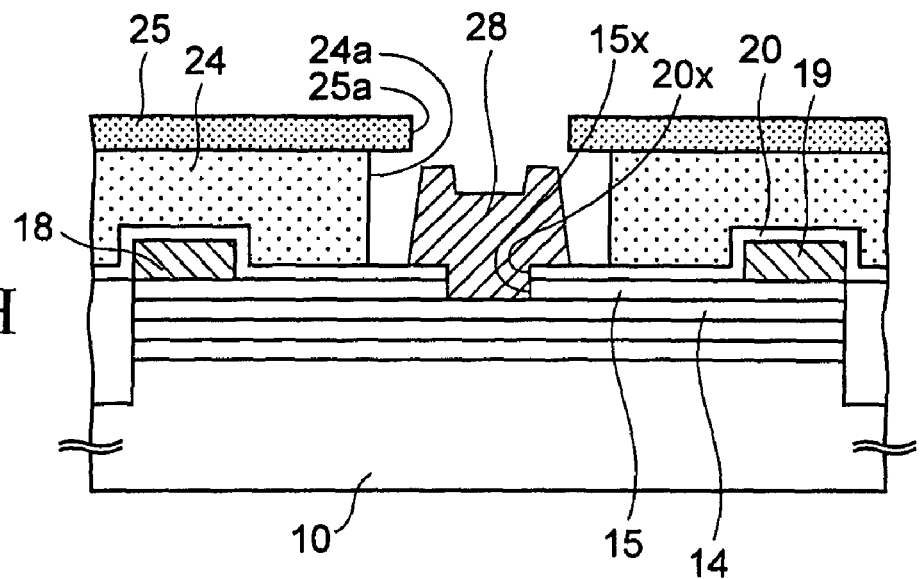

Next, as shown in FIG. 1H, a metal stacked film is formed inside the windows 24a and 25a by an evaporation method, so that a mushroom-shaped gate electrode 28 is formed inside the first and second openings 20x and 15x and on the first protective insulating film 20 in the periphery thereof. As such a metal stacked film, for example, a Ti layer with a thickness of approximately 10 nm, a Pt layer with a thickness of approximately 10 nm, and an Au layer with a thickness of approximately 300 nm are formed in this order. A Schottky junction is formed on a boundary between the gate electrode 28 and the electron supply layer 14.

Figure 1I:
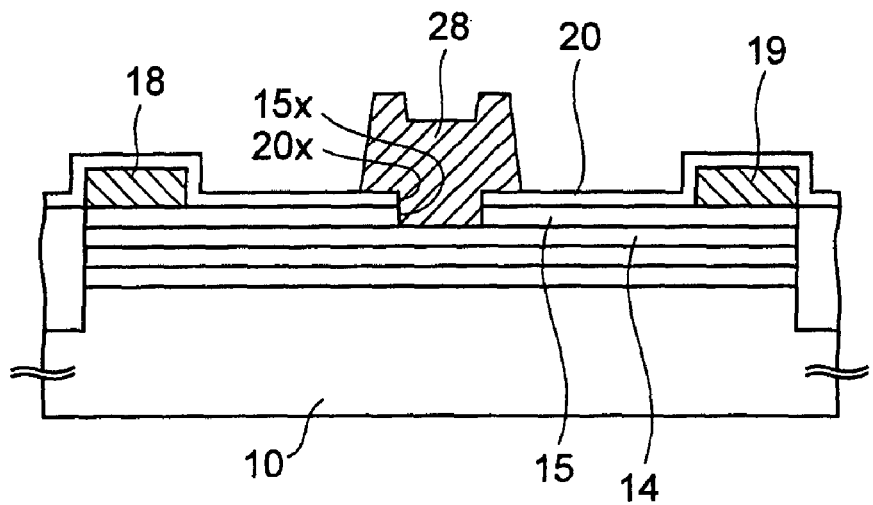

Then, as shown in FIG. 1I, the resin layer 24 and the second resist pattern 25 are removed to lift off the above-described metal stacked film formed on the second resist pattern 25 (unillustrated).

Figure 1J:
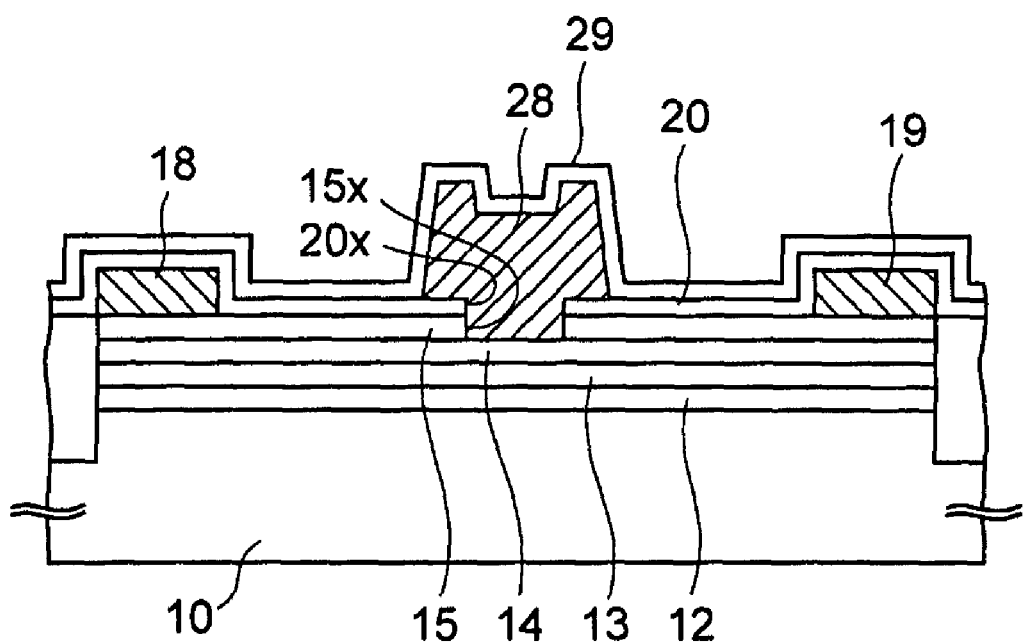

Thereafter, as shown in FIG. 1J, a second protective insulating film 29 composed of silicon nitride is formed on each of the gate electrode 28 and the first protective insulating film 20.

By performing the above processes, the basic structure of the semiconductor device according to the present embodiment is completed.

The semiconductor device is a junction field-effect transistor in which electrons are supplied from the electron supply layer 14 to the electron transport layer 13 and a gate voltage controls turn-on or turn-off of current flowing through the electron transport layer 13. In addition, since the gate electrode 28 is caused to have the mushroom-shaped cross-section, an area of the Schottky junction with the contact layer 15 becomes smaller and thus a gate length can be shortened. Moreover, the cross-section of an upper portion of the gate electrode 28 becomes larger, so that resistance of the gate electrode 28 can be lowered.

Next, the film-forming method of the above-described first protective insulating film 20 will be described in detail.

Figure 2:
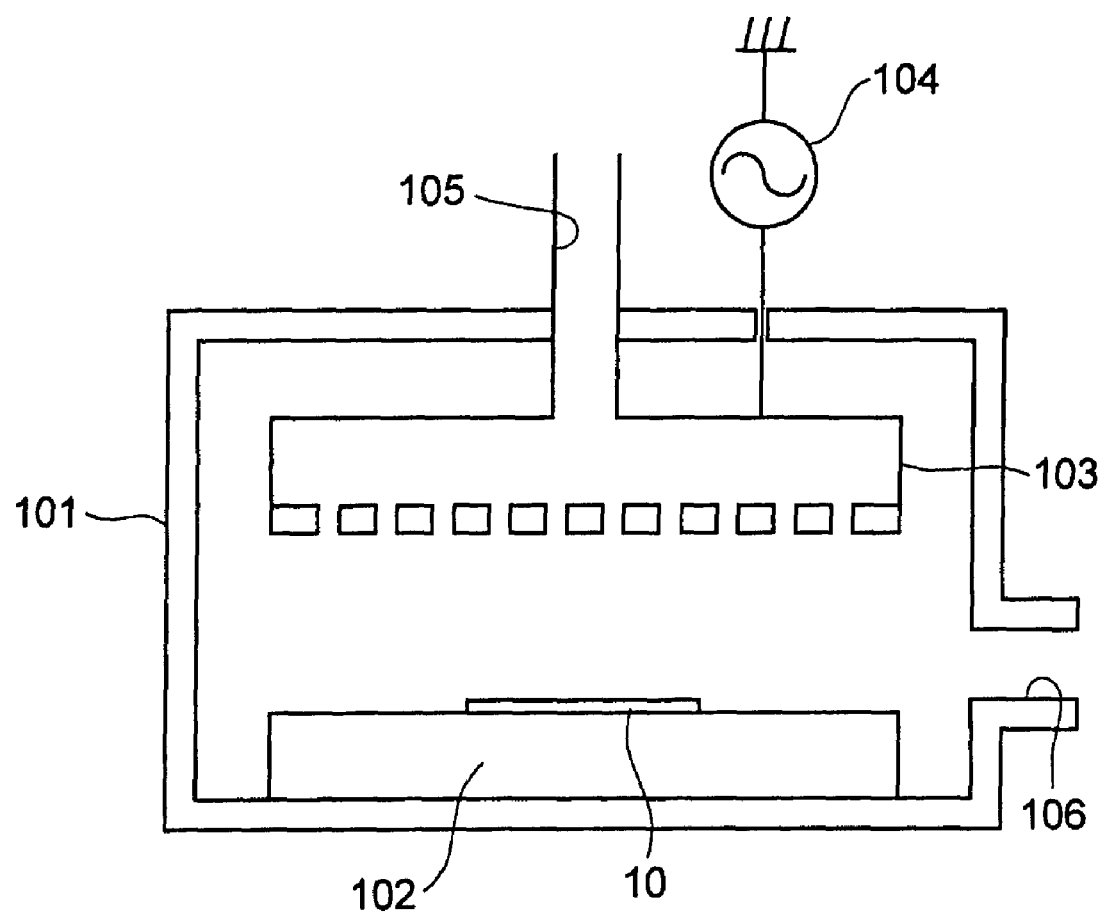
FIG. 2 is a view showing a configuration of a plasma CVD apparatus used in each embodiments.

As described above, the first protective insulating film 20 consists of a silicon nitride layer formed by a plasma CVD method. FIG. 2 is a view showing a configuration of a plasma CVD apparatus used for forming the first protective insulating film 20.

As shown in FIG. 2, the plasma CVD apparatus 100 has a chamber 101 whose inside can be decompressed by an unillustrated decompressing pump. In addition, a substrate mounting table 102 is provided inside the chamber 101, and a substrate 10 is mounted on the substrate mounting table 102. Note that unillustrated heating means, such as a heating wire, is built in the substrate mounting table 102 and the substrate 10 is heated to a predetermined temperature by the heating means.

Furthermore, a shower head 103 is provided above the substrate mounting table 102. The shower head 103 disperses reactant gas, which is introduced from a gas inlet 105, onto the surface of the substrate 10. In addition, a high-frequency power source 104 is electrically connected to the shower head 103 and high-frequency power supplied from the high-frequency power source 104 causes the reactant gas to form plasma. Also, source gas, which does not contribute to the reaction caused inside the chamber 101, is exhausted from an exhaust port 106 to the outside.

In order to protect a compound semiconductor layer such as the contact layer 15, performances such as adhesiveness with the semiconductor layer, denseness, and low stress are required to the first protective insulating film 20 (see FIG. 1J) formed by using such the plasma CVD apparatus 100.

Here, it is considered how the adhesiveness of the first protective insulating film 20 depends on the frequency of the high-frequency power source 104.

According to the research performed by the inventor of the present application, it became clear that when the frequency of the high-frequency power source 104 was low, for example 380 kHz, the adhesiveness between the first protective insulating film 20 and the base was increased, when compared with a case where the frequency thereof was high.

However, when the frequency of the high-frequency power source 104 is low as described above, precursors of plasmas inside the chamber 101 can follow the direction of an electric field, which slowly changes, and thus have a relatively high kinetic energy. Accordingly, electric damages, which the semiconductor substrate 10 receives by the precursors when the first protective insulating film 20 is formed, become larger.

On the other hand, when the frequency of the high-frequency power source 104 was high, for example 13.56 MHz, the adhesiveness between the first protective insulating film 20 and the base was lowered, when compared with the above-descried case where the frequency thereof was low.

However, when such a high frequency is employed, the precursors of the plasmas inside the chamber 101 cannot follow the direction of an electric field, which changes at a high speed. Accordingly, the kinetic energy of the precursors becomes smaller, and thus electric damages which the semiconductor substrate 10 receives become smaller.

In addition, degree of the denseness, i.e., a film density of the silicon nitride film varies depending on its film-forming conditions, different from a silicon oxide ($SiO_2$) film.

The silicon nitride film with a high density has an excellent blocking ability against moisture and the like. Accordingly, it has an advantage that can increase reliability of a device. However, it also has a disadvantage that easily causes peeling-off and the like due to high stress. In contrast, the silicon nitride film with a low density has a defect in blocking ability against moisture and the like. However, it has small stress, and thus has an advantage that hardly causes peeling-off due to the stress.

As described above, it is difficult for the single-layer silicon nitride film to satisfy all the requirements of high adhesiveness, denseness, low electric damages, and low stress at a time.

In light of the above-described characteristics of the silicon nitride film, the inventor of the present application came up with a film-forming method of the first protective insulating film 20 which will be described below.

First Example

Figure 3:
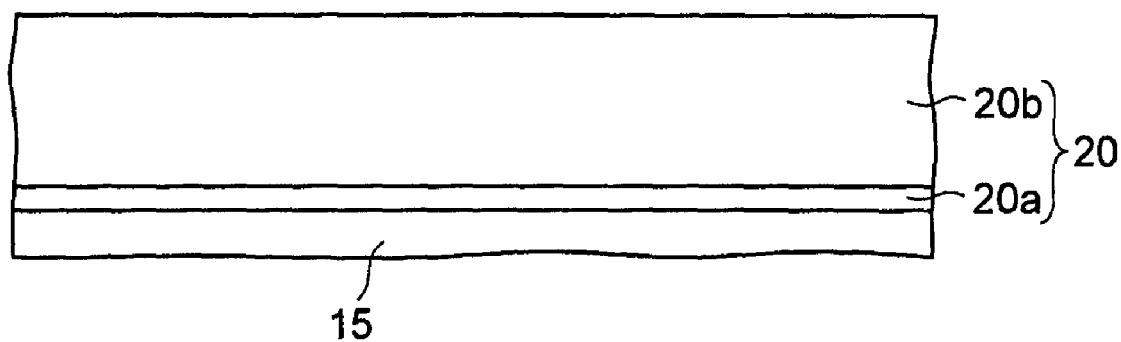
FIG. 3 is a cross-sectional view for illustrating a film-forming method of a first protective insulating film according to a first example of the first embodiment.

FIG. 3 is a cross-sectional view for illustrating a film-forming method of a first protective insulating film 20 according to a first example.

As shown in FIG. 3, in the present example, a first layer silicon nitride film 20a and a second layer silicon nitride film 20b with a film density lower than that of the silicon nitride film 20a are stacked in this order to form the first protective insulating film 20.

A high and low relationship of a density of a silicon nitride film generally corresponds to a high and low relationship of stress thereof. That is to say, the silicon nitride film with a high density has high stress, while the silicon nitride film with a low density has low stress, or the direction of the stress gets reversed.

For this reason, by stacking two types of silicon nitride films 20a and 20b with different densities as described above, the stress of the first protective insulating film 20 can be reduced as a whole, when compared with the case where the first protective insulating film is formed only of the silicon nitride film which has a high film density and high stress.

Moreover, a film with a high film density is employed as the first layer silicon nitride film 20a, so that water permeability of the silicon nitride film 20a can be lowered than that of the second layer silicon nitride film 20b. Thereby, the blocking ability of the first protective insulating film 20 against moisture in a portion near a contact layer 15 is increased. Accordingly, external moisture and the like can be easily prevented from reaching the contact layer 15.

Furthermore, the first layer silicon nitride film 20a has a high film density as described above. Thus, the amount of hydrogen contained in the silicon nitride film 20a becomes smaller than that contained in the second layer silicon nitride film 20b. Accordingly, the amount of hydrogen moving from the first protective insulating film 20 to the contact layer 15 or diffusion of hydrogen at an initial stage of film-forming can be reduced, as compared to the case of Patent literature 1. Thereby, donors in the compound semiconductor layer, such as the contact layer 15, can be prevented from being neutralized by the hydrogen. Thus, the electric characteristics of the transistor can be prevented from being deteriorated due to hydrogen.

There are several methods for lowering the film density of the second layer silicon nitride film 20b as described above.

In the present example, a gas containing ammonia is used as source gas for nitrogen of the second layer silicon nitride film 20b, and nitrogen is used as a source gas for nitrogen of the first layer silicon nitride film 20a. Thereby, the film density of the second layer silicon nitride film 20b can be lowered than that of the first layer silicon nitride film 20a. Incidentally, silane ($SiH_4$) is used as source gas for silicon of each of the films 20a and 20b.

One example of the film-forming conditions of the respective films 20a and 20b in this case are as follows.

(Film-Forming Conditions of the First Layer Silicon Nitride Film 20a)
Frequency of a high-frequency power source 104: 380 kHz
Power of the high-frequency power source 104: 50 W
Flow rate ratio of film-forming gases ($SiH_4$:$N_2$): 1:100
Substrate temperature: 250° C.
Film thickness: approximately 5 nm (Film-Forming Conditions of the Second Layer Silicon Nitride Film 20b)
Frequency of the high-frequency power source 104: 13.56 MHz
Power of the high-frequency power source 104: 50 W
Flow rate ratio of film-forming gases ($SiH_4$:$NH_3$:$N_2$): 1:0.5:100
Substrate temperature: 250° C.
Film thickness: approximately 45 nm The first layer silicon nitride film 20a formed according to these conditions had the refraction index of 2.05, the film density of 2.49 g/cm$^2$, and the stress of 500 MPa (compressive).

On the other hand, the second layer silicon nitride film 20b had the refraction index of 2.10, the film density of 2.15 g/cm$^2$, and the stress of 50 MPa (tensile).

As described above, it was actually confirmed that by using a gas containing ammonia as a source gas for nitrogen of the second silicon nitride film 20b, the film density of the second layer silicon nitride film 20b became lower than that of the first layer silicon nitride film 20a and the direction of the stress of the second layer silicon nitride film 20b got reversed with respect to that of the first layer silicon nitride film 20a. This is possibly because the gas containing ammonia was used as a source gas for nitrogen of the second layer silicon nitride film 20b and thus hydrogen was taken into the film.

In addition, it was also confirmed that the water permeability of the first layer silicon nitride film 20a became approximately one sixth of that of the second layer silicon nitride film 20b. Thus, it became clear that the blocking ability of the first layer silicon nitride film 20a against moisture was higher than that of the second layer silicon nitride film.

The method for lowering the film density of the second layer silicon nitride film 20b than that of the first layer silicon nitride film 20a is not limited to the above-described method.

FIG. 4 is a table showing research results of film densities of silicon nitride films obtained by variously changing film-forming conditions by using an RBS (Rutherford Backscattering Spectrometry). Note that, in this research, each silicon nitride film was formed on a silicon substrate (not shown). In addition, the densities of N, Si, and H were also checked.

As is clear from comparison between sample No. 1 and sample No. 2 of FIG. 4, the film density of the silicon nitride film can also be lowered by increasing the frequency of the high-frequency power source 104.

In addition, as is clear from comparison between sample No. 2 and sample No. 3, the film density of the silicon nitride film can also be lowered by adding ammonia to the reactant gas as described above.

The inventor of the present application found several other conditions of lowering the film density of the silicon nitride film. The film-forming conditions of the second layer silicon nitride film 20b, with which the film density of the second layer silicon nitride film 20b becomes lower than that of the first layer silicon nitride film 20a, can be summed up as follows.

(i) The frequency of high-frequency power (frequency of the high-frequency power source 104) to be applied to film-forming atmosphere is set higher than that to be applied in the process of forming the first layer silicon nitride film 20a.

(ii) The power of high-frequency power (power of the high-frequency power source 104) to be applied to the film-forming atmosphere is lowered than that to be applied in the process of forming the first layer silicon nitride film 20a.

(iii) The pressure of the film-forming atmosphere is set higher than that used in the process of forming the first layer silicon nitride film 20a.

(iv) Ammonia is used as a source gas for nitrogen and nitrogen is used as a source gas for nitrogen of the first layer silicon nitride film 20a.

(v) The substrate temperature is lowered than that used in the process of forming the first layer silicon nitride film 20a.

(vi) The film-forming speed is set faster than that used in the process of forming the first layer silicon nitride film 20a.

Any one of these conditions (i) to (vi) can be employed as a film-forming condition of the second layer silicon nitride film 20b.

Note that, in order to increase the film-forming speed of the second layer silicon nitride film 20b like (vi), the flow rate of the film-forming gas, for example, the flow rate of the mixed gas of $SiH_4$ and $N_2$ is set higher than that used when the first layer silicon nitride film 20a is formed.

Meanwhile, the film-forming conditions of the silicon nitride film whose film density becomes low, like (i) to (vi), result in film-forming conditions with radical character being enhanced. Under these conditions, precursors in plasma atmosphere have relatively low kinetic energy. Accordingly, the second layer silicon nitride film 20b composed of the silicon nitride film with a low film density can be formed as described above. Furthermore, since the kinetic energy of the precursors is low, electric damages which a substrate 10 and the like receive are low. Thus, the second layer silicon nitride film 20b can be formed with a relatively large thickness without regard to the above-described electric damages so much.

In contrast, the film-forming conditions of the silicon nitride film whose film density becomes high, like the first layer silicon nitride film 20a, are referred to as film-forming conditions with ionicity being enhanced. When compared with the film-forming conditions with radical character being enhanced, these film-forming conditions can lead to formation of the silicon nitride film 20a having excellent adhesiveness with the compound semiconductor layer such as the contact layer 15. Accordingly, the first protective insulating film 20 can be effectively prevented from being peeled off.

Meanwhile, under the film-forming conditions with ionicity being enhanced, the kinetic energy of the precursors in the plasma atmosphere is higher than that under the film-forming conditions with radical character being enhanced. Accordingly, the substrate 10 and the like easily receive electric damages during film-forming.

For this reason, in order to reduce the electric damages, it is preferable that the film thickness of the first layer silicon nitride film 20a be kept as ultrathin as several nanometers.

From the above-described viewpoint, it is preferable that the second layer silicon nitride film 20b be formed thickly without regard to electric damages which the substrate 10 would receive, and that the first layer silicon nitride film 20a be formed so as to be thinner than the second layer silicon nitride film 20b in order to reduce the electric damages.

Furthermore, as described above, it is preferable that respective thicknesses of the thinly-formed first layer silicon nitride film 20a and thickly-formed second layer silicon nitride film 20b be determined so that stress of the first protective insulating film 20 as a whole would come closer to zero as much as possible.

In addition, it is preferable that the first layer silicon nitride film 20a and the second layer silicon nitride film 20b be formed so as to have same refraction indexes as much as possible. With such a configuration, permittivity of the first protective insulating film 20 becomes constant. Accordingly, electric fields in the film can be prevented from becoming discontinuous along with variation in permittivity, and thus, reliability of the semiconductor device can be increased.

Meanwhile, the above-described patent literatures 2 to 4 disclose a protective insulating film that is configured of stacked films consisting of a silicon nitride film of the bottom layer and a silicon oxide film of the top layer.

However, a silicon oxide film has a difficulty in controlling stress according to film-forming conditions, when compared with a silicon nitride film. Thus, it is difficult to cause the stress of the protective insulating film as a whole to come closer to zero.

In contrast, in the present example, the first protective insulating film 20 is formed only of silicon nitride whose stress can be easily controlled according to the film-forming conditions. Accordingly, it is easy to cause the stress of the first protective insulating film 20 to come closer to zero, when compared with the case when a silicon oxide film is used. This is also true for second to fifth examples to be described below.

Second Example

Figure 5:
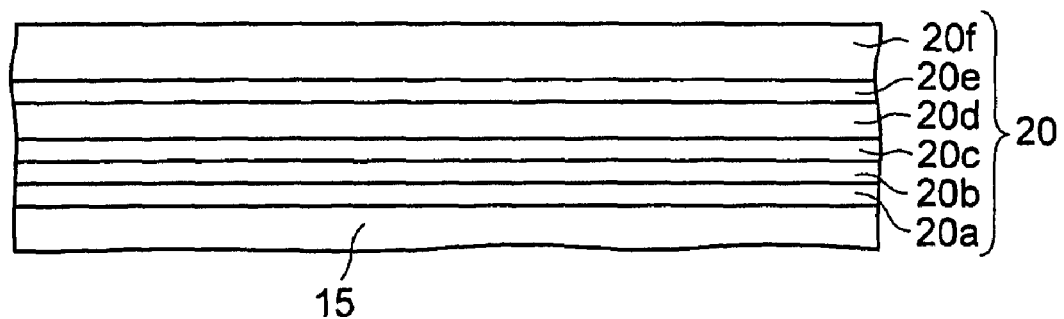
FIG. 5 is a cross-sectional view for illustrating a film-forming method of a first protective insulating film according to a second example of the first embodiment.

FIG. 5 is a cross-sectional view for illustrating a film-forming method of a first protective insulating film 20 according to a second example.

As shown in FIG. 5, in the present example, at least three silicon nitride films 20a to 20f are stacked to form the first protective insulating film 20.

As shown in FIG. 6, these silicon nitride films 20a to 20f are formed in such a manner that film densities thereof become alternately high or low. Note that, similar to the first example, the first and second layers are formed so that the film density of the second layer silicon nitride film 20b would be lower than that of the first layer silicon nitride film 20a.

As described above, a high and low relationship of a film density generally corresponds to a high and low relationship of stress. Accordingly, by stacking these films so as to alternately have the high and low film densities like the present example, the stress of the first protective insulating film 20 can be reduced as a whole, when compared with the case where the first protective insulating film 20 is formed of a single-layer silicon nitride film having a high film density.

By stacking at least three silicon nitride films as described above, internal stress added to each boundary between the upper and lower silicon nitride films can be lowered than that of the first example. Thus, a risk of causing peel-off of the silicon nitride film on each boundary can be reduced.

Moreover, as described in the first example, the first layer silicon nitride film 20a having a high film density is formed under film-forming conditions with ionicity being enhanced, so that adhesiveness between a contact layer 15 and the like and the base becomes preferable. Thus, the first protective insulating film 20 can be prevented from being peeled off.

As described above, the silicon nitride film having a low film density contains a relatively large amount of hydrogen in the film, and the hydrogens move to neutralize donors of the contact layer 15 and the like.

In light of the foregoing description, in the present example, as shown in FIG. 5, thicknesses of the silicon nitride films 20b, 20d, and 20f, each of which has a low film density, are set to be gradually thinner toward the bottom. Accordingly, the amount of hydrogen contained in the second layer silicon nitride film 20b closer to the contact layer 15 is reduced. Thereby, the amount of hydrogen moving from the second layer silicon nitride film 20b, which easily gives an impact on the contact layer 15, to the contact layer 15 can be reduced. Thus, the donors in the contact layer 15 and the like can be prevented from being neutralized.

To control the film densities of the nitride films 20a and 20f, any one of the conditions (i) to (vi) described in the first example may be used. One example of film-forming conditions of the respective nitride films 20a and 20f is as follows.

(Film-Forming Conditions of the First Layer Silicon Nitride Film 20a)
  Frequency of a high-frequency power source 104: 380 kHz
  Power of the high-frequency power source 104: 50 W
  Flow rate ratio of film-forming gases ($SiH_4:N_2$): 1:100
  Substrate temperature: 250° C.
  Film thickness: approximately 5 nm (Film-Forming Conditions of the Second Layer Silicon Nitride Film 20b)
  Frequency of the high-frequency power source 104: 13.56 MHz
  Power of the high-frequency power source 104: 50 W
  Flow rate ratio of film-forming gases ($SiH_4:NH_3:N_2$): 1:0.5:100
  Substrate temperature: 250° C.
  Film thickness: approximately 5 nm (Film-Forming Conditions of the Third Layer Silicon Nitride Film 20c)
  Frequency of the high-frequency power source 104: 13.56 MHz
  Power of the high-frequency power source 104: 50 W
  Flow rate ratio of film-forming gases ($SiH_4:N_2$): 1:100
  Substrate temperature: 250° C.
  Film thickness: approximately 5 nm Film-Forming Conditions of the Fourth Layer Silicon Nitride Film 20d)
  Frequency of the high-frequency power source 104: 13.56 MHz
  Power of the high-frequency power source 104: 50 W
  Flow rate ratio of film-forming gases ($SiH_4:NH_3:N_2$): 1:0.5:100
  Substrate temperature: 250° C.
  Film thickness: approximately 10 nm (Film-Forming Conditions of the Fifth Layer Silicon Nitride Film 20e)
  Frequency of the high-frequency power source 104: 13.56 MHz
  Power of the high-frequency power source 104: 50 W
  Flow rate ratio of film-forming gases ($SiH_4:N_2$): 1:100
  Substrate temperature: 250° C.
  Film thickness: approximately 5 nm Film-Forming Conditions of the Sixth Layer Silicon Nitride Film 20f)
  Frequency of the high-frequency power source 104: 13.56 MHz
  Power of the high-frequency power source 104: 50 W
  Flow rate ratio of film-forming gases ($SiH_4:NH_3:N_2$): 1:0.5:100
  Substrate temperature: 250° C.
  Film thickness: approximately 35 nm When such conditions were employed, the first layer silicon nitride film 20a had the film density of 2.49 $g/Cm^2$ and stress of 500 MPa (compressive). In addition, the second, fourth, and sixth layer silicon nitride films 20b, 20d, and 20f had the film density of 2.15 $g/cm^2$ and stress of 50 MPa (tensile). Then, the third and fifth layer silicon nitride films 20c and 20e had the film density of 2.42 $g/cm^2$ and stress of substantially zero.

As a result, the first protective insulating film had the refraction index of substantially 2.10 and the stress of substantially zero as a whole.

Furthermore, water permeability of the first layer silicon nitride film 20a became approximately one sixth of that of the second, fourth, and sixth layer silicon nitride films 20b, 20d, and 20f.

Note that, similar to the first example, in the present example, it is also preferable that permittivity of the first protective insulating film 20 be kept constant in the film so that electric fields in the film can be prevented from becoming discontinuous along with variation in permittivity, by causing the refraction indexes of the respective silicon nitride films 20a to 20f to be closer to one another.

Third Example

When compared with the second example, only the film-forming conditions of a first layer silicon nitride film 20a is different, and excepting this, the present example is same as the second example.

In the present example, following conditions are employed as the film-forming conditions of the first layer silicon nitride film 20a.

Frequency of a high-frequency power source 104: 13.56 MHz
  Power of the high-frequency power source 104: 80 W
  Flow rate ratio of film-forming gases ($SiH_4:N_2$): 1:80
  Substrate temperature: 250° C.
  Film thickness: approximately 5 nm As described above, in the present example, the power of the high-frequency power source 104 is increased more than that of the low density films (second, fourth, and sixth layer silicon nitride films) in the second example.

The first layer silicon nitride film 20a formed under the above-described conditions had the film density of 2.21 $g/cm^2$ and stress of 200 MPa (compressive). Second to sixth layer silicon nitride films 20*b* to 20*f* had the same film density and stress as those of the second example.

Fourth Example

Figure 7:
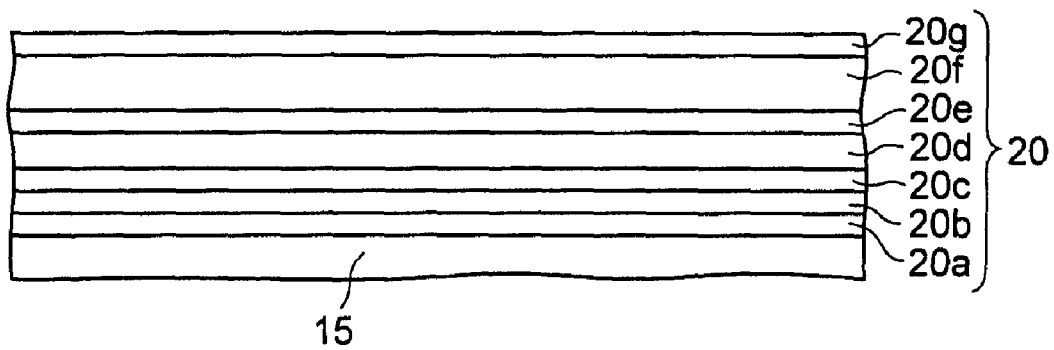
FIG. 7 is a cross-sectional view for illustrating a film-forming method of a first protective insulating film according to a fourth example of the first embodiment.

FIG. 7 is a cross-sectional view for illustrating a film-forming method of a first protective insulating film 20 according to the present example. As shown in FIG. 11, in the present example, a seventh layer silicon nitride film 20*g* is added on the top layer of the first protective insulating film 20 in the third example. The silicon nitride film 20*g* is formed so that a film density thereof would be higher than that of the sixth layer silicon nitride film 20*f* formed thereunder.

As described above, the silicon nitride film 20*g*, which has a high film density and excellent water-resistance, is formed on the top layer of the first protective insulating film 20. Thereby, moisture penetrating from the outside into a substrate 10 can be easily prevented by the silicon nitride film 20*g* and thus blocking ability of the first protective insulating film 20 against moisture can be increased.

Film-forming conditions of the seventh layer silicon nitride film 20*g* are not particularly limited. In the present example, the following conditions are employed.

Frequency of a high-frequency power source 104: 380 kHz
Power of the high-frequency power source 104: 50 W
Flow rate ratio of film-forming gases ($SiH_4$:$N_2$): 1:100
Substrate temperature: 250° C.
Film thickness: approximately 5 nm The seventh layer silicon nitride film 20*g* formed under these conditions had the film density of 2.49 g/cm$^2$ and the stress of 500 MPa (compressed).

Fifth Example

Figure 8:
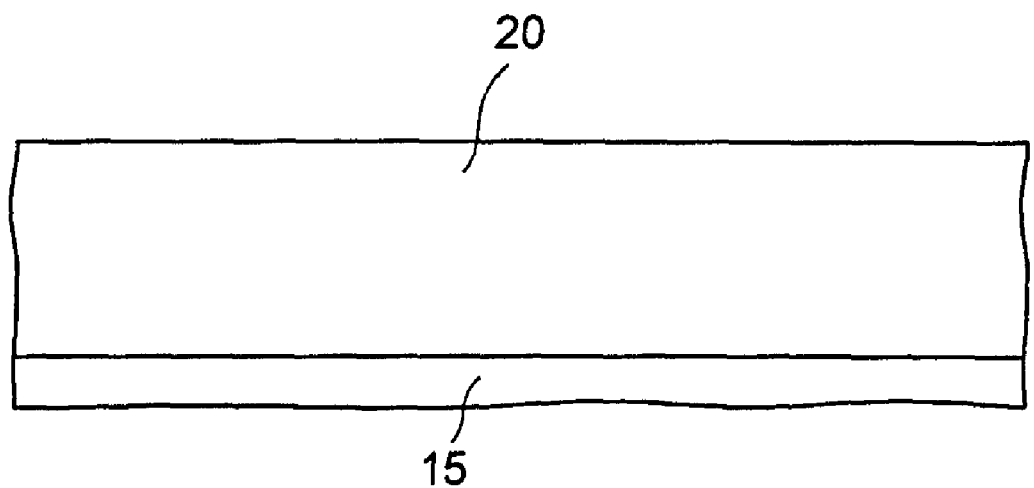
FIG. 8 is a cross-sectional view for illustrating a film-forming method of a first protective insulating film according to a fifth example of the first embodiment.

FIG. 8 is a cross-sectional view for illustrating a film-forming method of a first protective insulating film 20 according to a fifth example.

As shown in FIG. 8, in the present example, the first protective insulating film 20 is formed of a single-layer silicon nitride film whose film density becomes lower in the direction from the bottom to the top.

One example of film-forming conditions of the first protective insulating film 20 is as follows.

Firstly, a high-frequency power source 104 with a frequency of 13.56 MHz and the power of 50 W is used to start deposition of a silicon nitride film under the conditions that the substrate temperature is 250° C. and the flow rate ratio of film-forming gases ($SiH_4$:$NH_3$:$N_2$) is 1:0:100. Immediately after the start of the deposition, the flow rate ratio of the film-forming gases ($SiH_4$:$NH_3$:$N_2$) is caused to change from 1:0:100 to 1:0.5:100 in approximately two minutes without changing the power of the high-frequency power source 104 and the substrate temperature. Thereby, the first protective insulating film 20 composed of silicon nitride, whose film density becomes lower in the direction from the bottom to the top, is formed with a thickness of approximately 50 nm.

The first protective insulating film 20 formed as described above had, as a whole, a refraction index of substantially 2.10 and stress of approximately 100 MPa (tensile).

In addition, water permeability of the first protective insulating film 20 became approximately one second when compared with that of a silicon nitride film according to a comparative example in which a film density is not changed. Note that the silicon nitride film according to the comparative example was formed under conditions with a frequency of the high-frequency power source 104 of 13.56 MHz, power of 50 W, a flow rate ratio of film-forming gases ($SiH_4$:$NH_3$:$N_2$) of 1:0.5:100, and a substrate temperature of 250° C.

As described above, by continuously changing the film density in the first protective insulating film 20, the stress in the film continuously changes in the direction from the bottom to the top. Accordingly, the stress of the first protective insulating film 20 can be reduced as a whole, when compared with a high-density single-layer silicon nitride film whose film density does not change.

Furthermore, the first protective insulating film 20 according to the present example does not have a multi-layered structure like those of the first to fourth examples. Thus, the disadvantage that causes concentration of internal stress on each boundary between the layers can be essentially solved.

Moreover, according to the foregoing description, the density on the lower surface of the first protective insulating film 20 is higher than that on the upper surface thereof. Accordingly, the amount of hydrogen in the vicinity of the lower surface of the first protective insulating film 20 is reduced. Thus, it is easier to avoid the disadvantage that hydrogen moves to a contact layer 15 and the like to cause neutralization of donors.

Then, as described in the first example, the portion having a high density in the vicinity of the lower surface of the first protective insulating film 20 is formed under the film-forming conditions with ionicity being enhanced, so that adhesiveness between the contact layer 15 and the like and the base becomes preferable. Thus, the first protective insulating film 20 can be prevented from being peeled off.

The method for continuously changing the film density of the first protective insulating film 20 as has been described above is not limited to the above-described method. The film density of the first protective insulating film 20 can be changed by employing any one of the following film-forming conditions (i) to (v).

(i) The power of high-frequency power (power of the high-frequency power source 104) to be applied to the film-forming atmosphere is continuously lowered.

(ii) The pressure of the film-forming atmosphere is continuously increased.

(iii) A gas containing ammonia is used as a film-forming gas and a flow rate ratio of ammonia is continuously increased.

(iv) The film-forming speed is continuously increased.

In order to increase the film-forming speed like the condition (iv), for example, the flow rate of the film-forming gas may be continuously increased.

In addition, similar to the first example, in the present example, it is also preferable that permittivity of the first protective insulating film 20 be kept constant in the film so as to prevent electric fields in the film from being discontinuous along with variation in permittivity.

In the above-described first to fifth examples, the film-forming methods of the first protective insulating films 20 have been described, and each of the film-forming methods of the examples can be applied to a second protective insulating film 29.

(2) Second Embodiment

FIGS. 9A to 9K are cross-sectional views showing processes of manufacturing a semiconductor device according to the present embodiment. In these figures, same reference numerals as the first embodiment will be given to denote components same as those having described in the first embodiment, and the description thereof will be omitted.

In the present embodiment, only a method for forming a transistor is different from that of the first embodiment, and a film-forming method of a protective insulating film protecting the transistor is same as that of the first embodiment.

To manufacture the semiconductor device according to the present embodiment, processes of FIGS. 1A to 1C described in the first embodiment are firstly carried out.

Figure 9A:
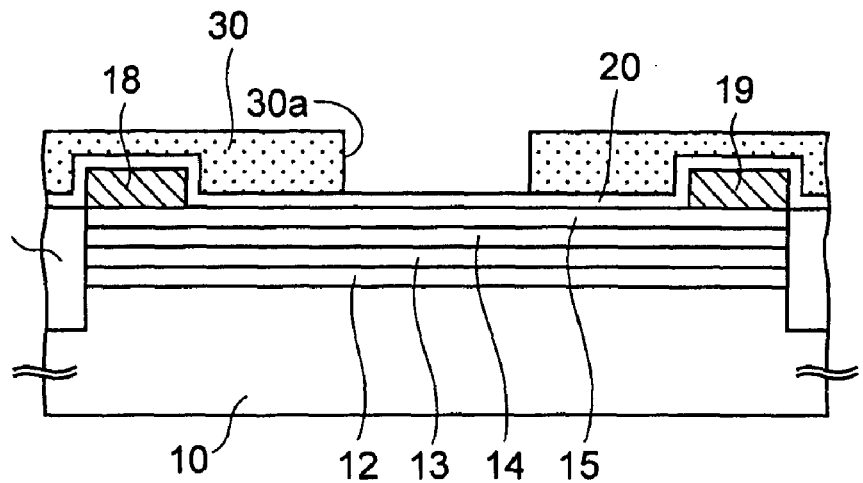
FIGS. 9A to 9K are cross-sectional views showing processes of manufacturing a semiconductor device according to a second embodiment.

Next, processes for obtaining a cross-sectional structure shown in FIG. 9A will be described.

Firstly, a positive electron beam resist is coated on a first protective insulating film 20 with a thickness of approximately 300 nm by spin coating. The coated resist is baked by heating under conditions with a substrate temperature of 180° C. and processing time of five minutes. The positive electron beam resist is not particularly limited. In the present embodiment, ZEP520-A7, produced by ZEON Corporation Japan, is used.

Then, the resist is exposed by an electron beam exposure apparatus, and thereafter is developed to form a resist pattern 30 having a first window 30a between a source electrode 18 and a drain electrode 19.

Figure 9B:
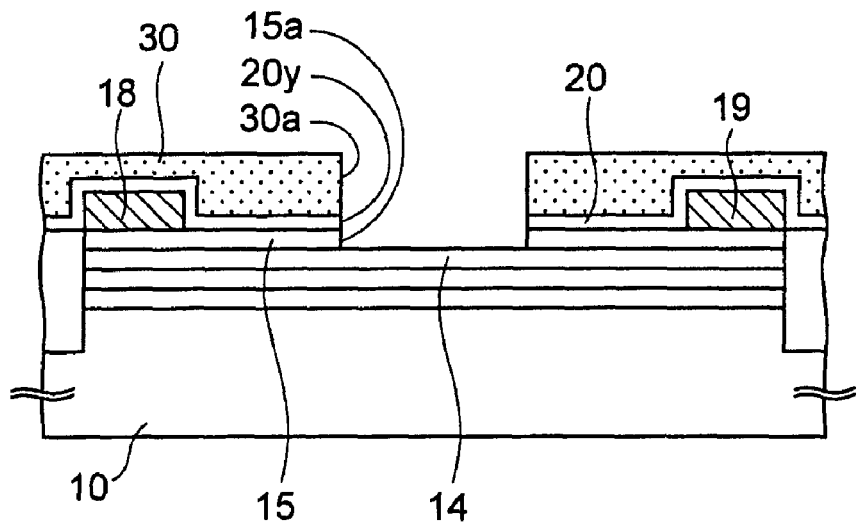

Next, as shown in FIG. 9B, the first protective insulating film 20 is etched through the first window 30a of the resist pattern 30 by dry etching using $SF_6$ as an etching gas to form a first opening 20y in the first protective insulating film 20.

Furthermore, a contact layer 15 is dry-etched through the above-described first window 30a to form a second opening 15a in the contact layer 15. For example, $SiCl_4$ is used for an etching gas to the contact layer 15.

Incidentally, widths of the first and second openings 20y and 15a are not particularly limited. In the present embodiment, the width is set to be approximately 0.2 μm.

Thereafter, the resist pattern 30 is removed.

Figure 9C:
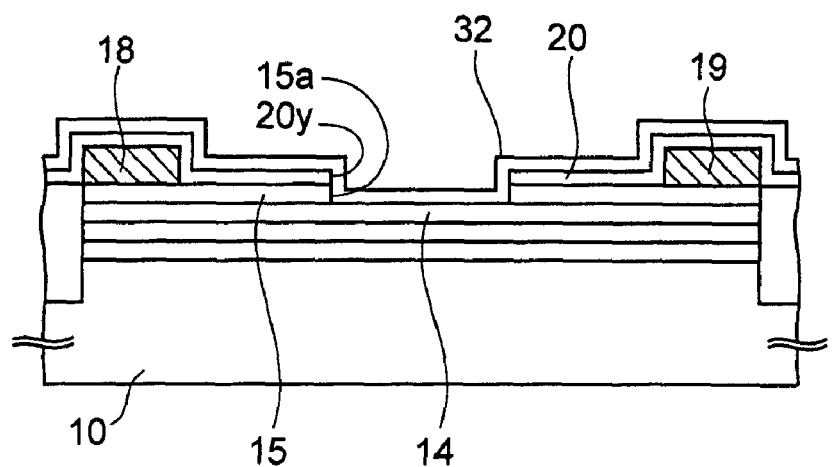

Next, as shown in FIG. 9C, a second protective insulating film 32 formed of silicon nitride is formed, by using a plasma CVD method, on the first protective insulating film 20 and inside the openings 15a and 20y. As a film-forming method of the second protective insulating film 32, any one of the first to fifth examples described in the first embodiment can be employed.

Figure 9D:
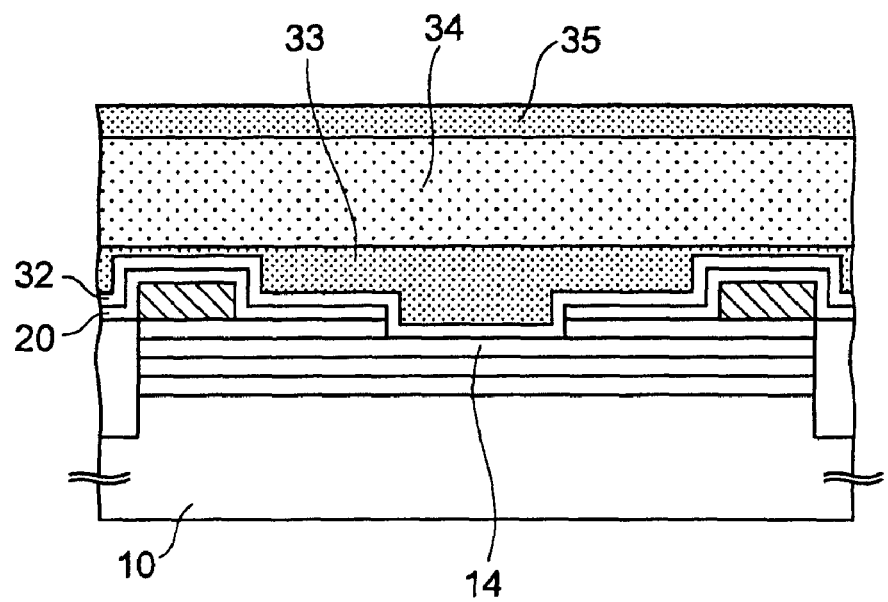

Subsequently, as shown in FIG. 9D, for example, ZEP520-A7, produced by ZEON Corporation Japan, is coated with a thickness of approximately 300 nm by spin coating, as a first positive electron beam resist 33 on the second protective insulating film 32. Thereafter, this first positive electron beam resist 33 is cured by heating under conditions with a substrate temperature of 180° C. and processing time of five minutes.

Furthermore, polymethylglutarimide, which is soluble in alkaline solution and is capable of side etching, is formed on the first positive electron beam resist 33 with a thickness of approximately 500 nm by spin coating. The resultant film is set to be a resin layer 34. The resin layer 34 is cured by thermal treatment. Conditions for the thermal treatment are not limited. In the present embodiment, the substrate temperature is set to be 180° C. and the processing time is set to be three minutes.

Subsequently, a second positive electron beam resist 35 is coated with a thickness of approximately 200 nm by spin coating on the resin layer 34. As the second positive electron beam resist 35, for example, there is ZEP520-A7, produced by ZEON Corporation Japan. Thereafter, the second positive electron beam resist 35 is cured by heating under conditions with a substrate temperature of 180° C. and processing time of two minutes.

Figure 9E:
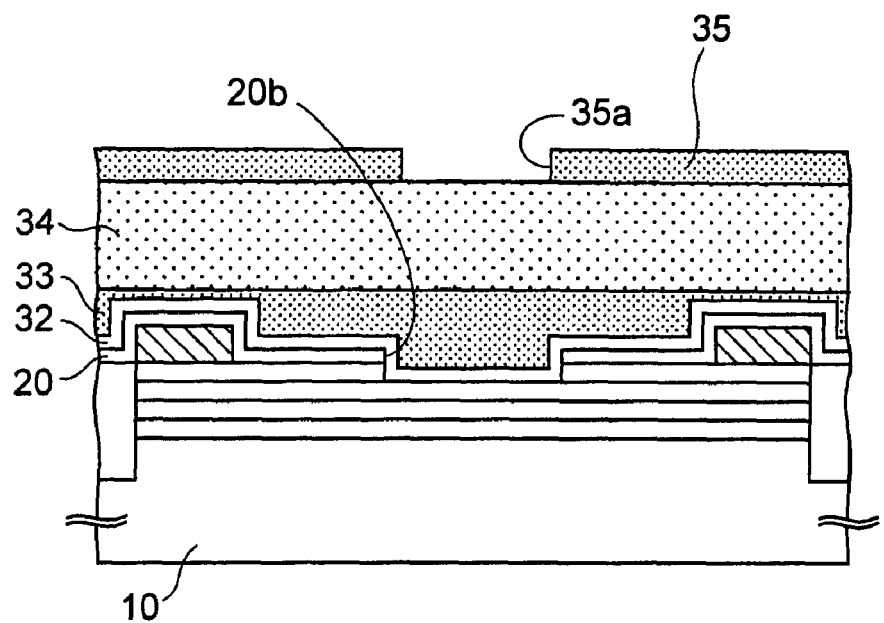

Next, as shown in FIG. 9E, the second positive electron beam resist 35 is exposed by using an electron beam exposure apparatus. Thereafter, the second positive electron beam resist 35 is developed by a developer formed of a mixed solution of methyl ethyl ketone (MEK) and methyl isobutyl ketone (MIBK). Thereby, a second window 35a is formed above the first opening 20y.

Figure 9F:
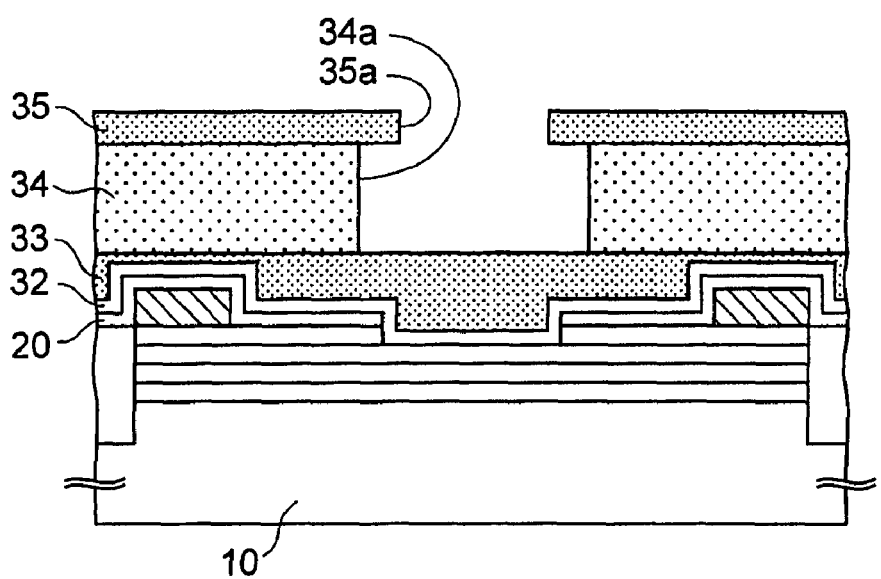

Subsequently, as shown in FIG. 9F, the resin layer 34 is side-etched through the second window 35a by using an alkaline etchant, such as tetramethyl ammonium hydroxide, to form a third window 34a whose width is larger than that of the second window.

Figure 9G:
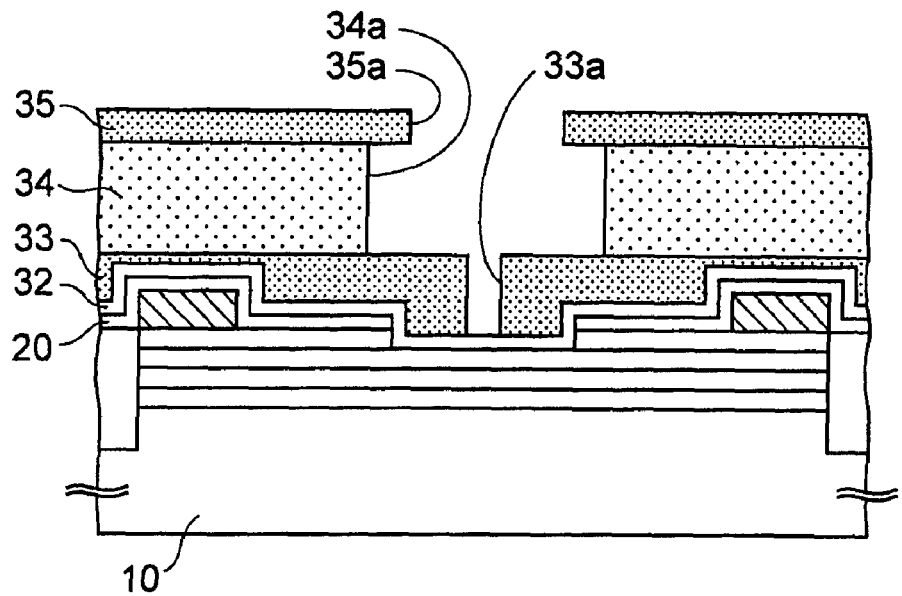

Next, as shown in FIG. 9G, the first positive electron beam resist 33 is exposed by the electron beam exposure apparatus. Thereafter, the resist 33 is developed by a developer formed of a mixed solution of methyl isobutyl ketone and isopropyl alcohol (IPA) to form a fourth window 33a whose width is smaller than that of the third window 34a.

Figure 9H:
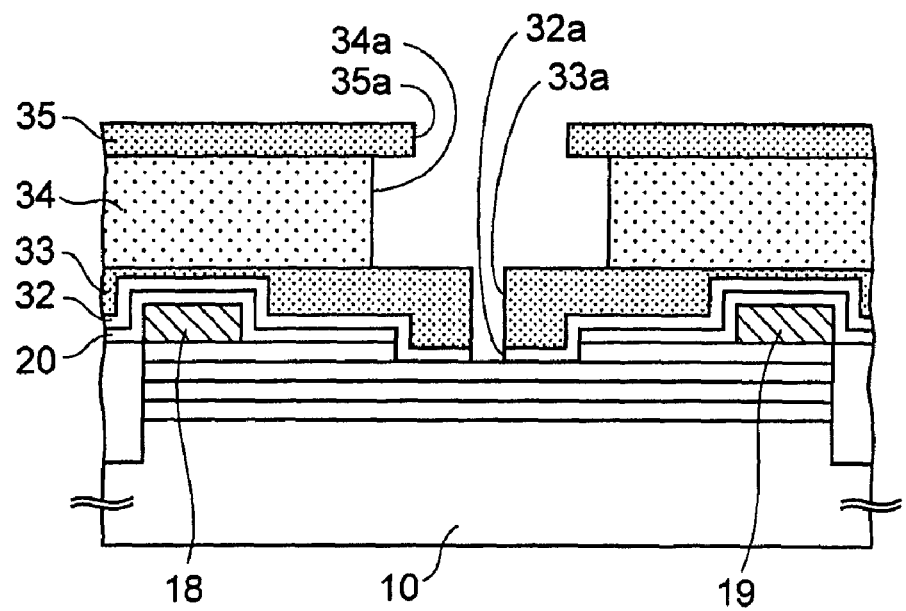

After that, as shown in FIG. 9H, the second protective insulating film 32 is etched through the fourth window 33a to form a third opening 32a in the second protective insulating film 32 between the source electrode 18 and the drain electrode 19. During this dry etching, for example, $SF_6$ is used as an etching gas.

Figure 9I:
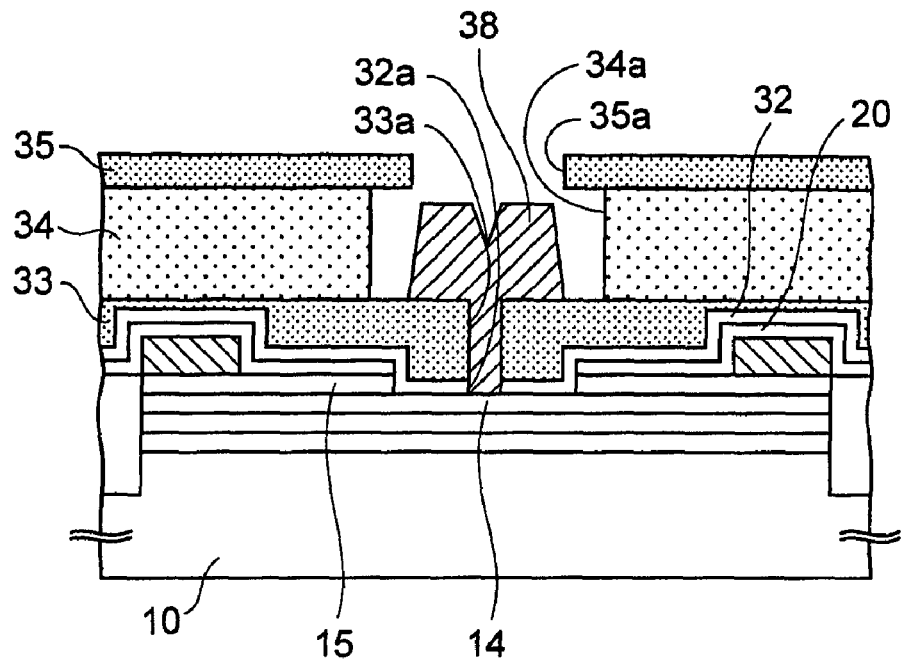

Next, as shown in FIG. 9I, a metal stacked film is formed inside the respective windows 33a to 35a by an evaporation method. Thereby, a mushroom-shaped gate electrode 38 is formed on an electron supply layer 14 inside the third opening 32a. The metal stacked film is formed by stacking, for example, a Ti layer with a thickness of approximately 10 nm, a Pt layer with a thickness of approximately 10 nm, and an Au layer with a thickness of approximately 300 nm in this order.

Figure 9J:
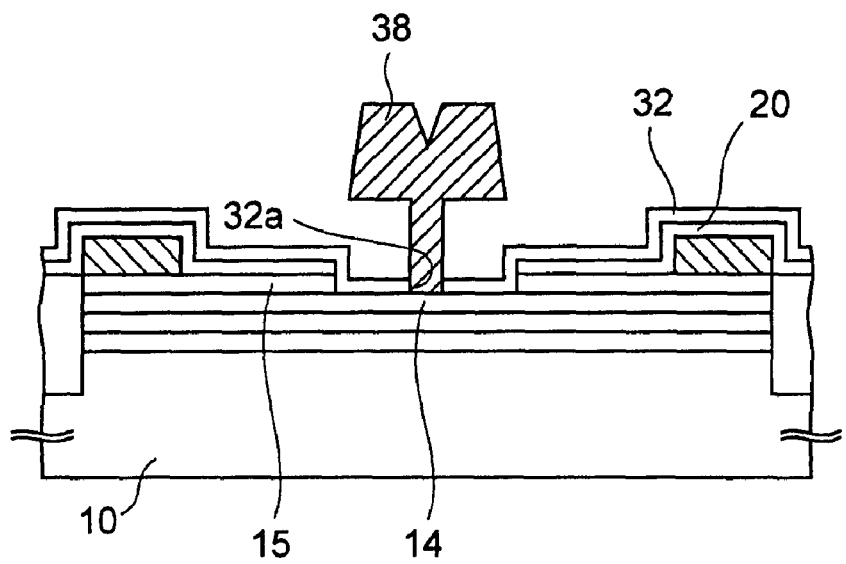

Then, as shown in FIG. 9J, the first and second positive electron beam resists 33 and 35 and the resin layer 34 are removed to lift off the above-described metal stacked film (not shown) formed on the second positive electron beam resist 35.

Figure 9K:
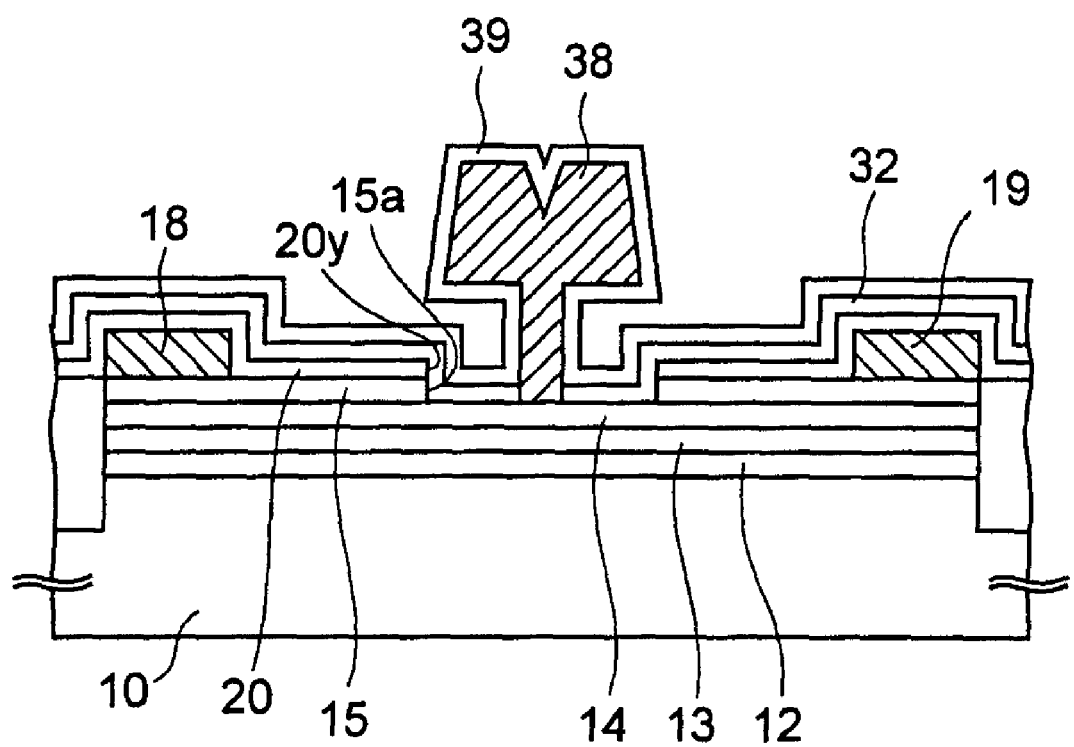

Thereafter, as shown in FIG. 9K, a third protective insulating film 39 composed of silicon nitride is formed on each of the gate electrode 38 and the second protective insulating film 32.

By performing the above processes, the basic structure of the semiconductor device according to the present embodiment is completed.

This semiconductor device is, similar to the first embodiment, a junction field-effect transistor in which a gate voltage controls the turn-on or turn-off of current flowing through an electron transport layer 13.

As described above, in the semiconductor device, the first to third protective insulating films 20, 32, and 39, composed of silicon nitride, are formed. Film-forming methods of these protective insulating films 20, 32, and 39 are not particularly limited. It is preferable that any one of the first to fifth examples described in the first embodiment be employed as a film-forming method thereof to reduce stress of each protective insulating film. In addition, the film-forming methods of the respective protective insulating films 20, 32, and 39 are not necessarily same, and the films may be formed by different methods.

(3) Third Embodiment

FIGS. 10A to 10J are cross-sectional views showing processes of manufacturing a semiconductor device according to the present embodiment.

Firstly, processes for obtaining a cross-sectional structure shown in FIG. 10A will be described.

Firstly, a buffer layer 12, an electron transport layer 13 formed of GaN, an electron supply layer 14 formed of AlGaN, and a surface layer 40 formed of GaN are caused to grow epitaxially on a high-resistant SiC substrate 10 by using a MOCVD method. Of these layers, the buffer layer 12 has a function to prevent lattice defects on the surface of the SiC substrate 10 from influencing the electron transport layer 13.

Subsequently, argon is ion-implanted into each of the layers 12 to 15 and SiC substrate 10, in a region where a transistor is not formed, to cause donors in the region to be inactive. Thereby, device isolation regions 11 are formed.

Figure 10A:
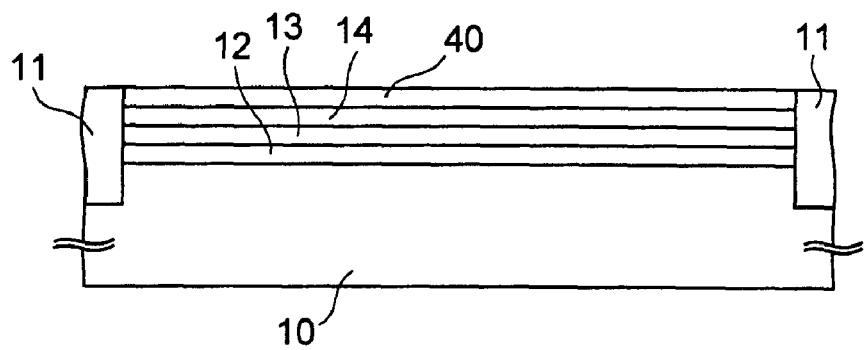
FIGS. 10A to 10J are cross-sectional views showing processes of manufacturing a semiconductor device according to a third embodiment.
Figure 10B:
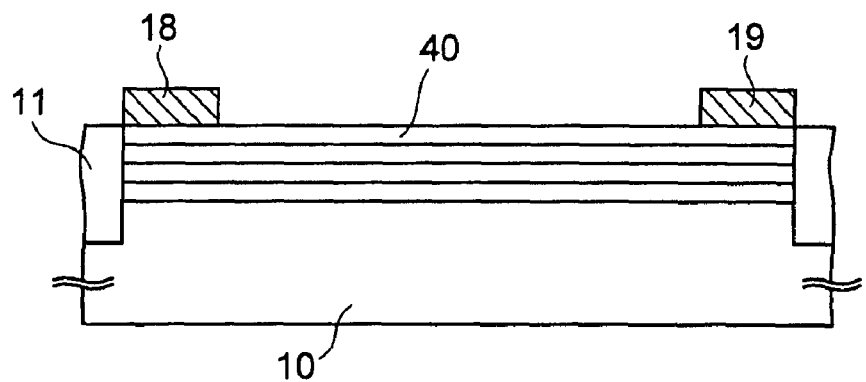

After that, as shown in FIG. 10B, a Ti film with a thickness of approximately 30 nm and an Al film with a thickness of approximately 100 nm are formed in this order on the surface layer 40 by photolithography and a vacuum evaporation method. Then, a source electrode 18 and a drain electrode 19 are formed with being spaced from each other, and are thermally processed at a temperature of 400° C. to 1000° C. for three minutes to form ohmic contact.

Figure 10C:
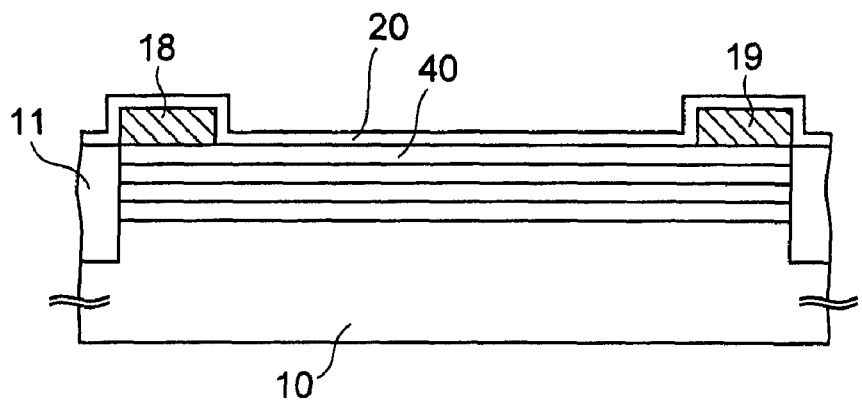

Thereafter, as shown in FIG. 10C, a first protective insulating film 20 composed of silicon nitride is formed on the surfaces of the electrodes 18 and 19 and the surface layer 40 by a plasma CVD method. This first protective insulating film 20 is formed in order to protect the surface of the surface layer 40, which is chemically and physically weak, to prevent the surface thereof from being oxidized during manufacturing processes, and to improve electric characteristics of a transistor which is to be finally obtained.

As a film-forming method of the first protective insulating film 20, any one of the first to fifth examples described in the first embodiment can be employed.

Figure 10D:
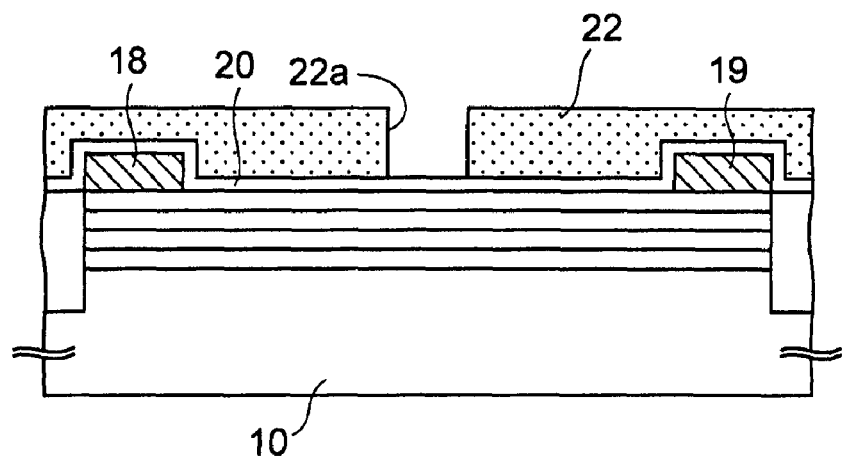

Next, as shown in FIG. 10D, a UV-sensitive photoresist is coated on the first protective insulating film 20. The coated film is exposed and developed to form a first resist pattern 22 having a first window 22a between the electrodes 18 and 19. In the present embodiment, PFI32-A8, produced by Sumitomo Chemical Co., Ltd., is used as the UV-sensitive photoresist.

Figure 10E:
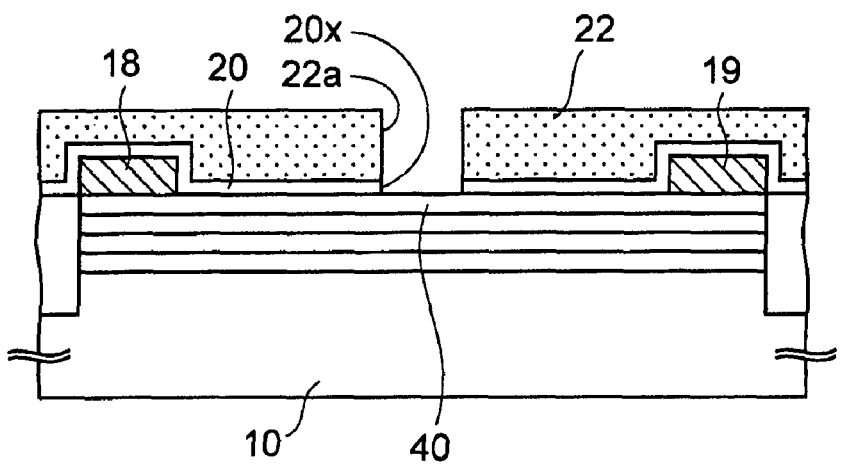

After that, as shown in FIG. 10E, by using the above-described first resist pattern 22 as a mask, the first protective insulating film 20 is etched by dry etching using $SF_6$ as an etching gas to form an opening 20x in the first protective insulating film 20 under the first window 22a.

After this etching is finished, the first resist pattern 22 is removed by using a heated stripping agent.

Figure 10F:
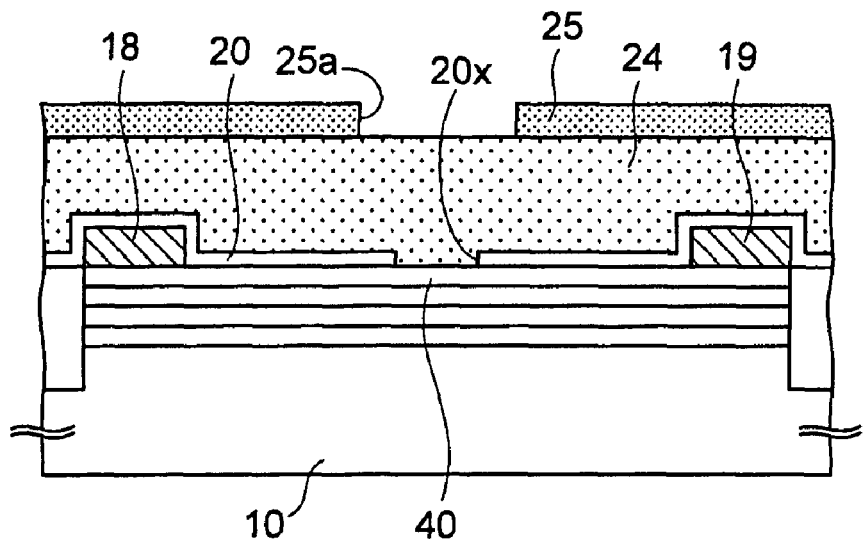

Next, as shown in FIG. 10F, a resin, which is soluble in alkaline solution and can be side-etched, for example, polymethylglutarimide is formed into a resin layer 24 with a thickness of approximately 500 nm on the first protective insulating film 20 and inside the opening 20x.

Then, the resin layer 24 is cured by heating under conditions with the substrate temperature of 180° C. and processing time of three minutes.

Thereafter, a UV-sensitive photoresist is coated on the resin layer 24. The coated resin layer is exposed and developed to form a second resist pattern 25 having a second window 25a whose width is larger than that of the opening 20x. The UV-sensitive photoresist is not particularly limited. In the present embodiment, PFI32-A8, produced by Sumitomo Chemical Co., Ltd., is used.

Figure 10G:
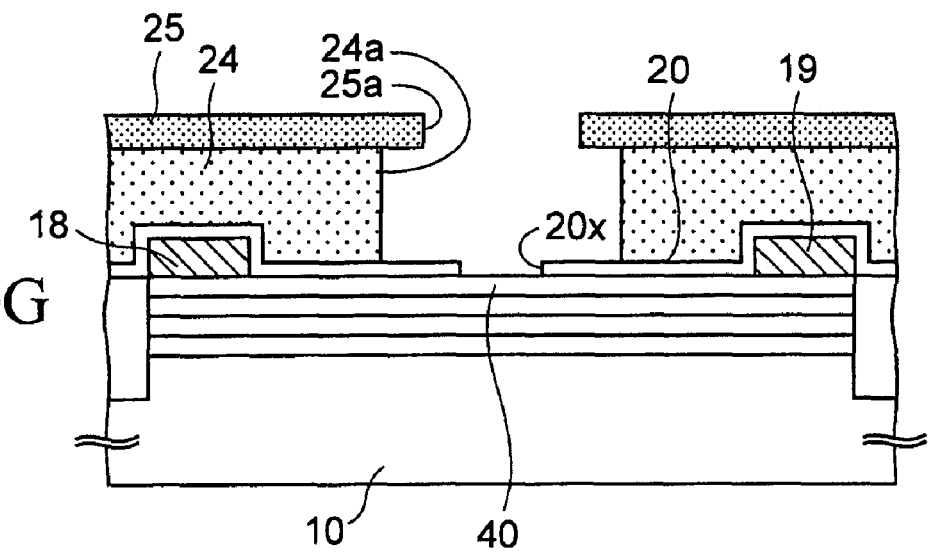

Subsequently, as shown in FIG. 10G, the resin layer 24 is wet-etched through the second window 25a of the second resist pattern 25. In the wet etching, an alkaline etchant selectively etching the resin layer 24, for example, an aqueous solution of tetramethyl ammonium hydroxide, is used for side etching of the resin layer 24.

Thereby, a third window 24a whose width is larger than that of the second window 25a is formed in the resin layer 24, and the surface layer 40 inside the opening 20x is exposed from the third window 24a.

Figure 10H:
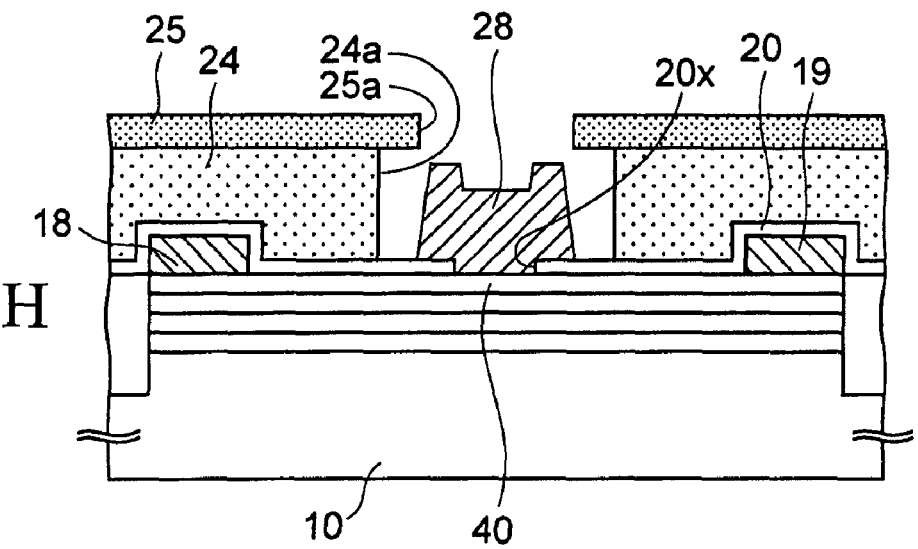

Next, as shown in FIG. 10H, a metal stacked film is formed inside the respective windows 24a and 25a by an evaporation method, so that a mushroom-shaped gate electrode 28 is formed inside the opening 20x and on the first protective insulating film 20 in the periphery thereof. As such a metal stacked film, for example, an Ni layer with a thickness of approximately 10 nm and an Au layer with a thickness of approximately 100 nm are formed in this order. A Schottky junction is formed on a boundary between the gate electrode 28 and the surface layer 40.

Figure 10I:
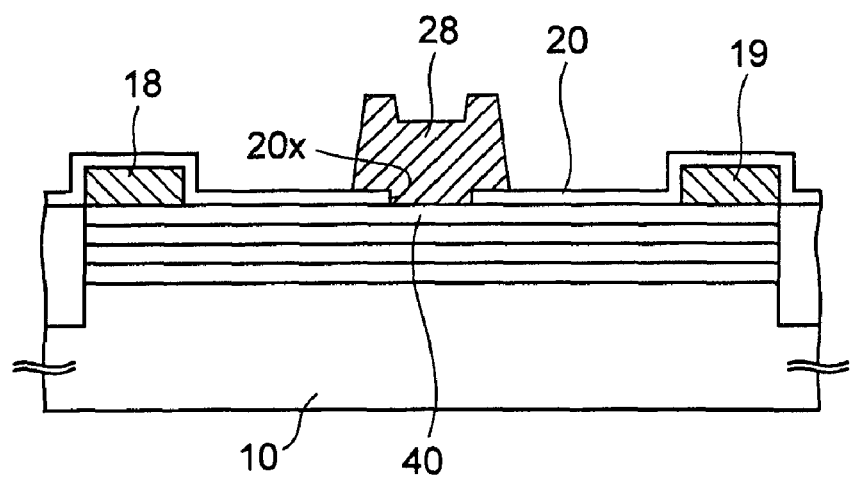

Then, as shown in FIG. 10I, the resin layer 24 and the second resist pattern 25 are removed to lift off the above-described metal (not shown) stacked film formed on the second resist pattern 25.

Figure 10J:
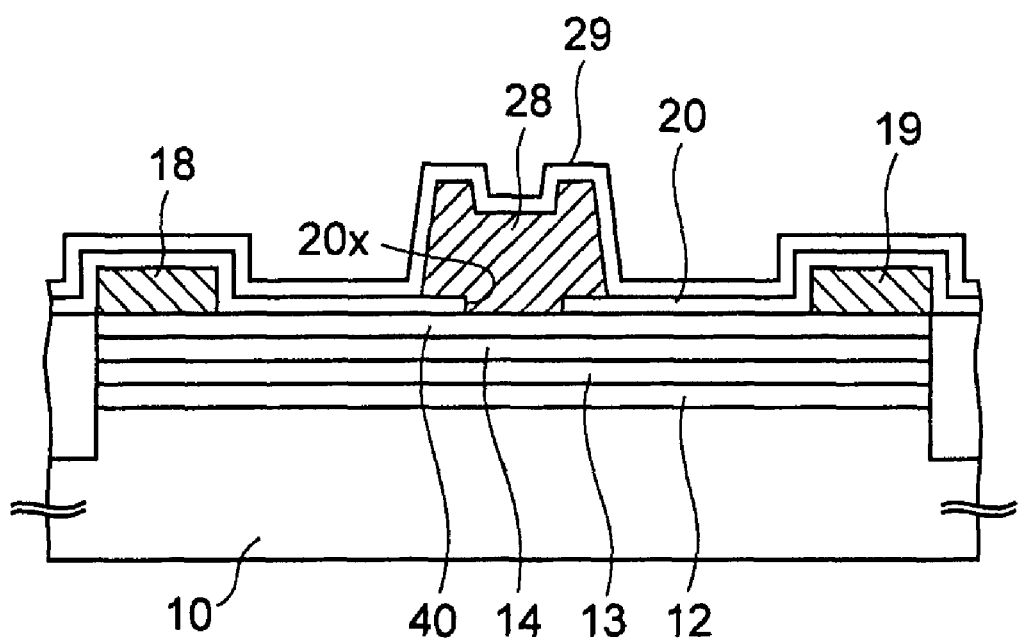

Thereafter, as shown in FIG. 10J, a second protective insulating film 29 composed of silicon nitride is formed on each of the gate electrode 28 and the first protective insulating film 20.

By performing the above processes, the basic structure of the semiconductor device according to the present embodiment is completed.

The semiconductor device is, similar to the first embodiment, a junction field-effect transistor in which a gate voltage controls turn-on or turn-off of current flowing through the electron transport layer 13.

As described above, in the semiconductor device, the first and second protective insulating films 20 and 29, composed of silicon nitride, are formed. Film-forming methods of these protective insulating films 20 and 29 are not particularly limited. It is preferable that any one of the first to fifth examples described in the first embodiment be employed as a film-forming method thereof to reduce stress of each protective insulating film. In addition, the film-forming methods of the respective protective insulating films 20 and 29 are not necessarily same, and the films may be formed by different methods.

(4) Fourth Embodiment

FIGS. 11A to 11K are cross-sectional views showing processes of manufacturing a semiconductor device according to the present embodiment.

To manufacture the semiconductor device according to the present embodiment, processes of FIGS. 10A to 10C described in the third embodiment are firstly carried out.

Figure 11A:
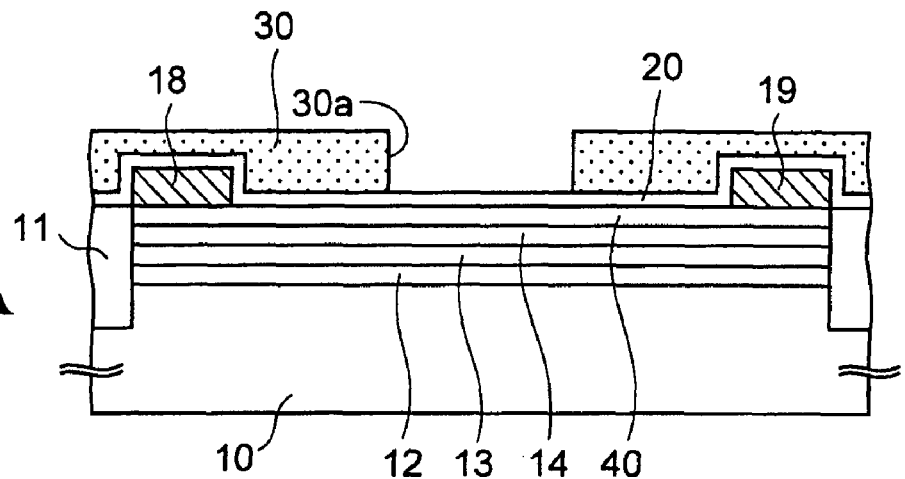
FIGS. 11A to 11K are cross-sectional views showing processes of manufacturing the semiconductor device according to the fourth embodiment.

Next, processes for obtaining a cross-sectional structure shown in FIG. 11A will be described.

Firstly, a positive electron beam resist is coated with a thickness of approximately 300 nm by spin coating on a first protective insulating film 20. The coated resist is cured by heating under conditions with a substrate temperature of 180° C. and processing time of five minutes. The positive electron beam resist is not particularly limited. In the present embodiment, ZEP520-A7, produced by ZEON Corporation Japan, is used.

After that, the resist is exposed by an electron beam exposure apparatus, and thereafter is developed to form a resist pattern 30 having a first window 30a between a source electrode 18 and a drain electrode 19.

Figure 11B:
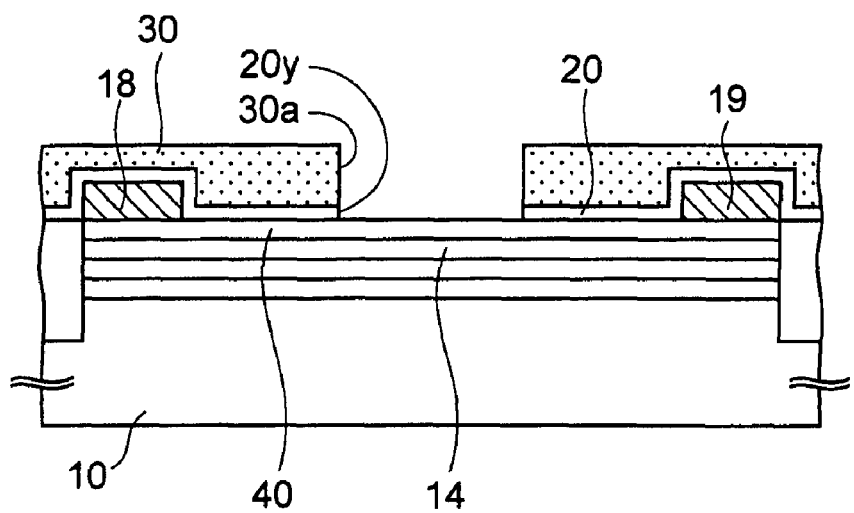

Next, as shown in FIG. 11B, the first protective insulating film 20 is etched through the first window 30a of the resist pattern 30 by dry etching using $SF_6$ as an etching gas to form a first opening 20y in the first protective insulating film 20.

Incidentally, the width of the first opening 20y is not particularly limited. In the present embodiment, it is set to be approximately 0.2 µm.

Thereafter, the resist pattern 30 is removed.

Figure 11C:
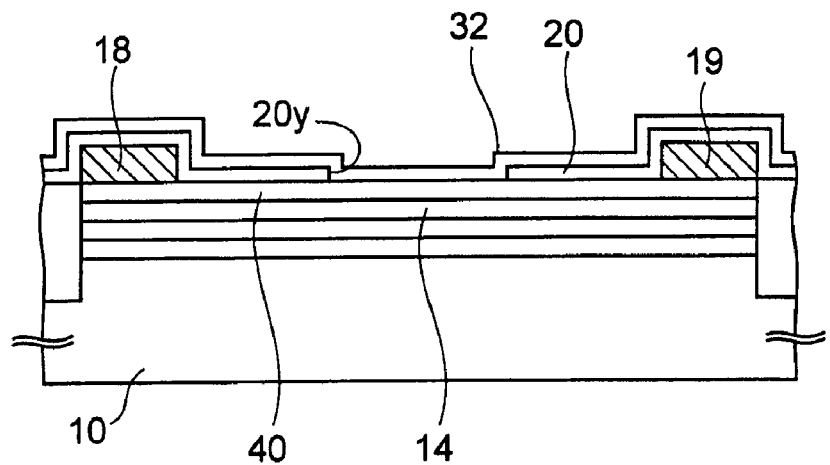

Next, as shown in FIG. 11C, a second protective insulating film 32 formed of silicon nitride is formed, by using a plasma CVD method, on the first protective insulating film 20 and inside the first opening 20y. As a film-forming method of the second protective insulating film 32, any one of the first to fifth examples described in the first embodiment can be employed.

Figure 11D:
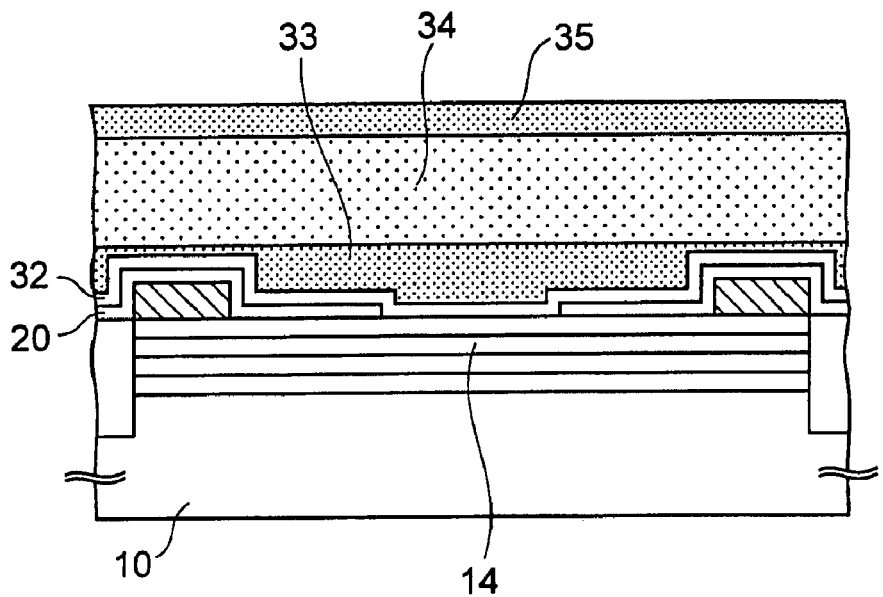
Figure 11E:
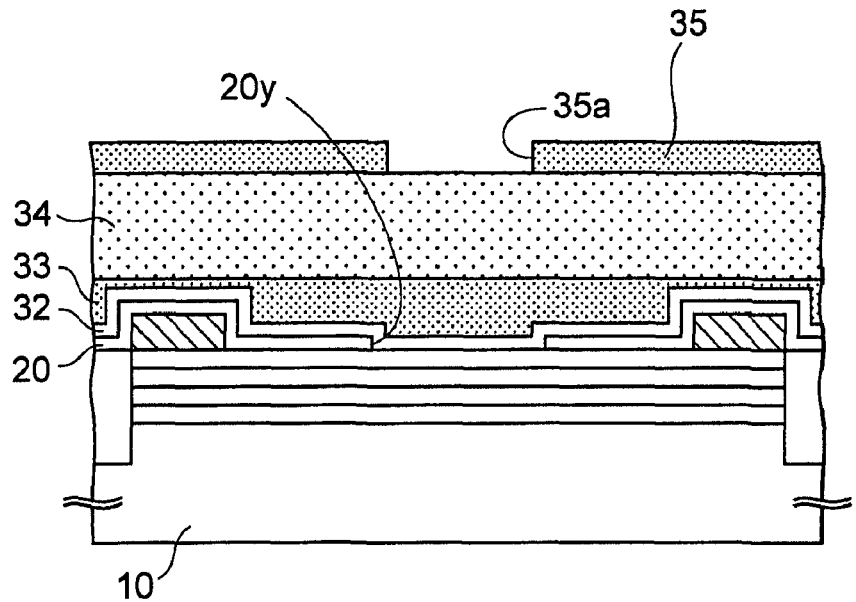

Subsequently, as shown in FIG. 11D, for example, ZEP520-A7 as a first positive electron beam resist 33, produced by ZEON Corporation Japan, is coated with a thickness of approximately 300 nm by spin coating on the second protective insulating film 32. Thereafter, this first positive electron beam resist 33 is cured by heating under conditions with a substrate temperature of 180° C. and processing time of five minutes.

Furthermore, polymethylglutarimide, which is soluble in alkaline solution and is capable of side etching, is formed with a thickness of approximately 500 nm by spin coating on the first positive electron beam resist 33. The resultant film is set to be a resin layer 34. The resin layer 34 is cured by thermal treatment. Conditions for the thermal treatment are not limited. In the present embodiment, the substrate temperature is set to be 180° C. and the processing time is set to be three minutes.

Subsequently, a second positive electron beam resist 35 is coated with a thickness of approximately 200 nm by spin coating on the resin layer 34. As the second positive electron beam resist 35, for example, there is ZEP520-A7, produced by ZEON Corporation Japan. Thereafter, the second positive electron beam resist 35 is cured by heating under conditions with a substrate temperature of 180° C. and processing time of two minutes.

Next, as shown in FIG. 1E, the second positive electron beam resist 35 is exposed by using an electron beam exposure apparatus. Thereafter, the second positive electron beam resist 35 is developed by a developer formed of a mixed solution of methyl ethyl ketone and methyl isobutyl ketone. Thereby, a second window 35a is formed above the first opening 20y.

Figure 11F:
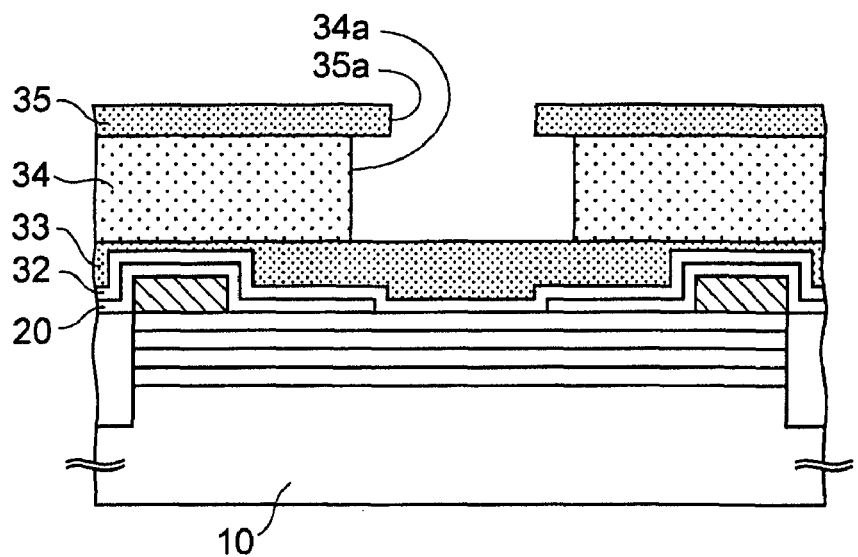

Subsequently, as shown in FIG. 11F, the resin layer 34 is side-etched through the second window 35a by using an alkaline etchant, such as tetramethyl ammonium hydroxide, to form a third window 34a whose width is larger than that of the second window.

Figure 11G:
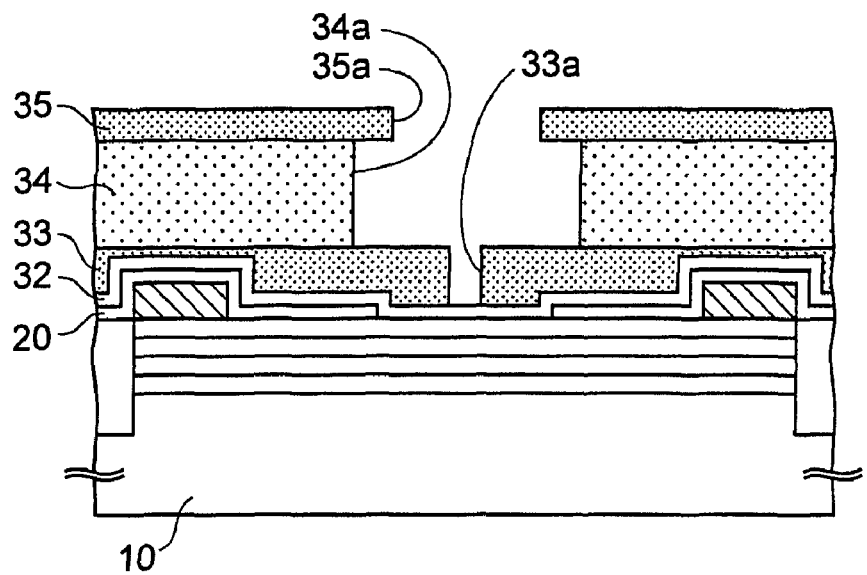

Next, as shown in FIG. 11G, the first positive electron beam resist 33 is exposed by the electron beam exposure apparatus. Thereafter, the resist 33 is developed by a developer formed of a mixed solution of methyl isobutyl ketone and isopropyl alcohol to form a fourth window 33a whose width is smaller than that of the third window 34a.

Figure 11H:
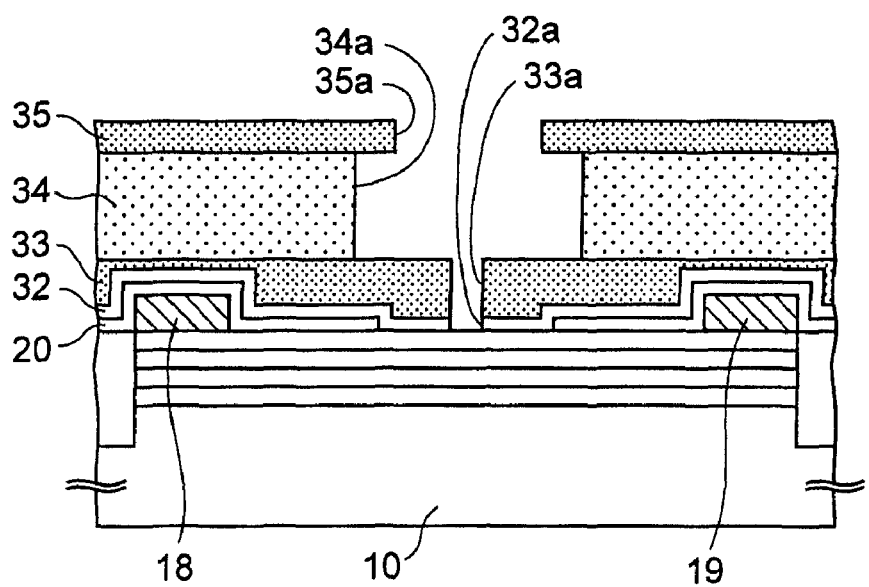

After that, as shown in FIG. 11H, the second protective insulating film 32 is etched through the fourth window 33a to form a second opening 32a in the second protective insulating film 32 between the source electrode 18 and the drain electrode 19. During this dry etching, for example, $SF_6$ is used as an etching gas.

Figure 11I:
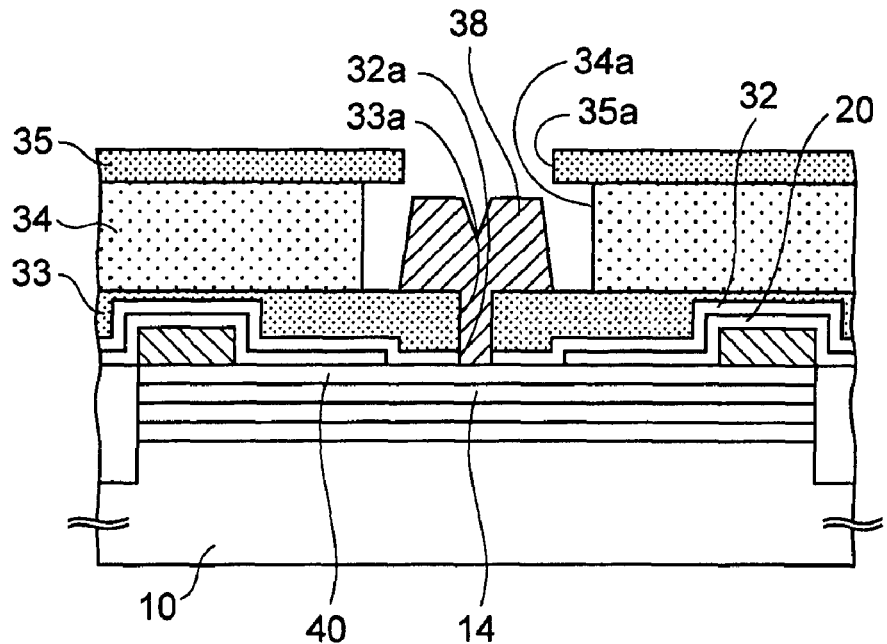

Next, as shown in FIG. 11I, a metal stacked film is formed inside the respective windows 33a to 35a by an evaporation method. Thereby, a mushroom-shaped gate electrode 38 is formed on a surface layer 40 inside the second opening 32a. The metal stacked film is formed by stacking, for example, an Ni layer with a thickness of approximately 10 nm and an Au layer with a thickness of approximately 100 nm in this order.

Figure 11J:
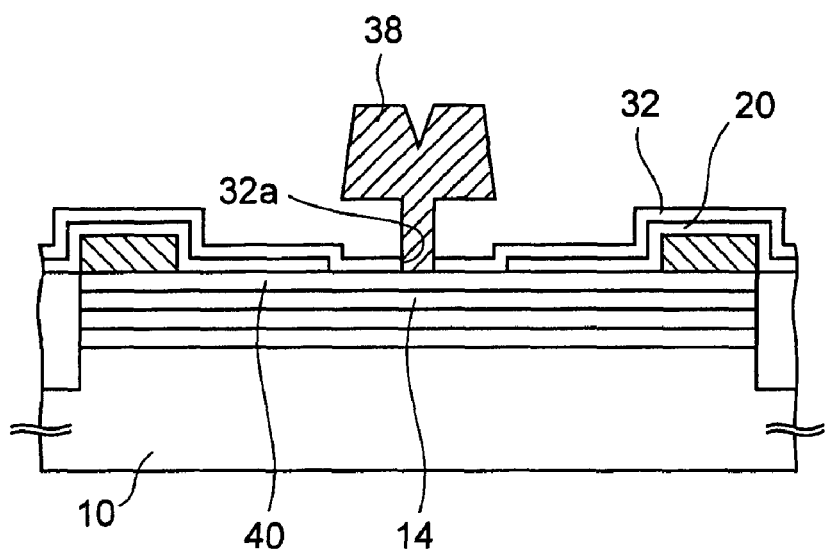

Then, as shown in FIG. 11J, the first and second positive electron beam resists 33 and 35 and the resin layer 34 are removed to lift off the above-described metal stacked film (not shown) formed on the second positive electron beam resist 35.

Figure 11K:
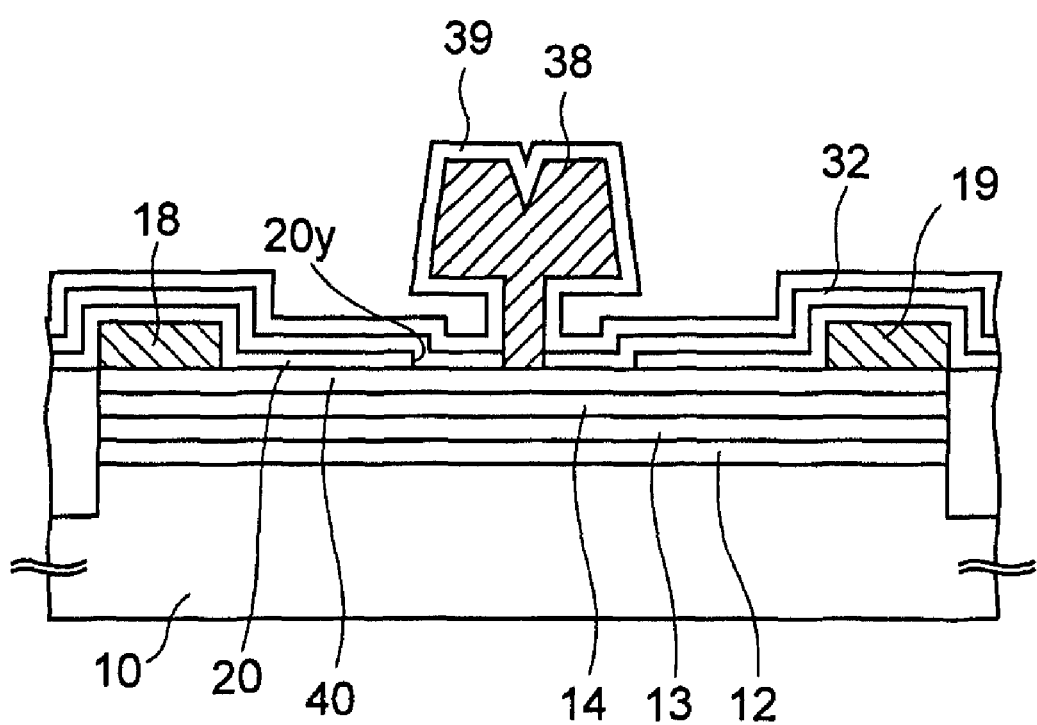

Thereafter, as shown in FIG. 11K, a third protective insulating film 39 composed of silicon nitride is formed on each of the gate electrode 38 and the second protective insulating film 32.

By performing the above processes, the basic structure of the semiconductor device according to the present embodiment is completed.

The semiconductor device is, similar to the first embodiment, a junction field-effect transistor in which a gate voltage controls the turn-on or turn-off of current flowing through an electron transport layer 13.

As described above, in the semiconductor device, the first to third protective insulating films 20, 32, and 39, composed of silicon nitride, are formed. Film-forming methods of these protective insulating films 20, 32, and 39 are not particularly limited. It is preferable that any one of the first to fifth examples described in the first embodiment be employed to reduce stress of the respective protective insulating films. In addition, the film-forming methods of the respective protective insulating films 20, 32, and 39 are not necessarily same, and the films may be formed by different methods.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device, comprising:
a substrate;
a compound semiconductor layer formed over the substrate; and
a protective insulating film composed of silicon nitride, which is formed over a surface of the compound semiconductor layer,
wherein the protective insulating film is formed of a single-layer silicon nitride film whose film density becomes lower from a bottom to a top of the protective insulating film.

2. The semiconductor device according to claim 1, wherein the compound semiconductor layer is a stacked compound semiconductor layer in which a buffer layer, an electron transport layer, an electron supply layer, and a contact layer having a first opening are formed in this order,
a source electrode and a drain electrode are formed on the contact layer with being spaced from each other,
the protective insulating film is also formed on the source electrode and the drain electrode, and has a second opening overlapping the first opening between the source electrode and the drain electrode, and
a gate electrode is formed on the electron supply layer in the first opening.

3. The semiconductor device according to claim 1, wherein the compound semiconductor layer is a stacked compound semiconductor layer in which a buffer layer, an electron transport layer, an electron supply layer, and a contact layer having a first opening are formed in this order,
a source electrode and a drain electrode are formed on the contact layer with the first opening being interposed therebetween, the protective insulating film is also formed on the source electrode and the drain electrode, and has a second opening on the first opening, and a gate electrode is formed on the electron supply layer in the second opening.

4. The semiconductor device according to claim 1, wherein the compound semiconductor layer is a stacked compound semiconductor layer in which a buffer layer, an electron transport layer, an electron supply layer, and a surface layer are formed in this order, a source electrode and a drain electrode are formed on the surface layer with being spaced from each other, the protective insulating film is also formed on the source electrode and the drain electrode and has an opening between the source electrode and the drain electrode, and a gate electrode is formed on the surface layer inside the opening.

5. The semiconductor device according to claim 1, wherein the substrate is formed of a compound semiconductor.

* * * * *